(12) United States Patent  (10) Patent No.: US 7,804,583 B2
Phillips et al.  (45) Date of Patent: Sep. 28, 2010

(54) EUV RETICLE HANDLING SYSTEM AND METHOD

(75) Inventors: Alton H. Phillips, East Palo Alto, CA (US); Michael R. Sogard, Menlo Park, CA (US); Douglas C. Watson, Campbell, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 12/242,050

(22) Filed: Sep. 30, 2008

(65) Prior Publication Data

US 2009/0027639 A1  Jan. 29, 2009

Related U.S. Application Data

(63) Continuation of application No. 11/238,237, filed on Sep. 28, 2005, now Pat. No. 7,477,358.

(60) Provisional application No. 60/614,118, filed on Sep. 28, 2004.

(51) Int. Cl.
G03B 27/62 (2006.01)
G03B 27/52 (2006.01)
(52) U.S. Cl. .......................... 355/75; 355/30
(58) Field of Classification Search ............... 355/53, 355/75, 51, 72, 30; 430/5, 30; 438/584; 414/217
See application file for complete search history.

(56) References Cited

U.S. PATENT DOCUMENTS

| 6,090,176 | A | 7/2000 | Yoshitake et al. |
| 6,110,844 | A | 8/2000 | Rader et al. |
| 6,123,120 | A | 9/2000 | Yotsumoto et al. |
| 6,239,863 | B1 | 5/2001 | Catey et al. |
| 6,253,464 | B1 | 7/2001 | Klebanoff et al. |
| 6,267,123 | B1 | 7/2001 | Yoshikawa et al. |
| 6,281,510 | B1 | 8/2001 | Yoshitake et al. |
| 6,289,868 | B1 | 9/2001 | Jayne |
| 6,317,479 | B1 | 11/2001 | Chiba et al. |
| 6,413,321 | B1 | 7/2002 | Kim et al. |
| 6,422,247 | B2 | 7/2002 | Yoshikawa et al. |

(Continued)

FOREIGN PATENT DOCUMENTS

EP   1 341 042 A2   9/2003

(Continued)

OTHER PUBLICATIONS

Blum, Brian, et al., "ASML Approach to EUV Reticle Protection," EUV Symposium, Dallas, Texas, Nov. 13, 2002, p. 1-28.

(Continued)

*Primary Examiner*—Peter B Kim
(74) *Attorney, Agent, or Firm*—Finnegan, Henderson, Farabow, Garrett & Dunner, LLP

(57) ABSTRACT

An enclosure for protecting at least a pattern side and an opposing side of a reticle is disclosed. The enclosure includes a first and second part that form an enclosure around a reticle to be protected during handling, inspection, storage, and transport. A method for transporting the reticle to an exposure position from a position outside an exposure chamber is disclosed, including a method for use of a load-lock chamber.

9 Claims, 29 Drawing Sheets

U.S. PATENT DOCUMENTS

| | | |
|---|---|---|
| 6,558,962 B2 | 5/2003 | Nishiki |
| 6,646,720 B2 | 11/2003 | Ramamoorthy et al. |
| 7,159,719 B2 | 1/2007 | Golda |
| 7,197,912 B1 | 4/2007 | Duce et al. |
| 2003/0035095 A1 | 2/2003 | Phillips et al. |
| 2003/0082030 A1* | 5/2003 | del Puerto et al. ........... 414/217 |
| 2003/0162101 A1 | 8/2003 | Heerens et al. |
| 2003/0218728 A1 | 11/2003 | del Puerto et al. |
| 2003/0224295 A1 | 12/2003 | Heerens et al. |
| 2003/0227605 A1 | 12/2003 | del Puerto et al. |
| 2004/0019408 A1 | 1/2004 | del Puerto et al. |
| 2004/0135987 A1 | 7/2004 | Galburt |
| 2004/0180270 A1* | 9/2004 | Heerens ........................ 430/5 |
| 2004/0185987 A1 | 9/2004 | Ruzansky |
| 2007/0206173 A1* | 9/2007 | Suzuki et al. ................. 355/75 |
| 2007/0211232 A1 | 9/2007 | Phillips et al. |

FOREIGN PATENT DOCUMENTS

| | | |
|---|---|---|
| JP | 10-261560 | 9/1998 |
| JP | 11-054400 | 2/1999 |

OTHER PUBLICATIONS

Blum, Brian, "EUVL Reticle Handling Workshop," ASML, Feb. 2003, p. 1-9.

Yoshitake, S. et al., "New Mask Blank Handling System for the Advanced Electron Beam Writer," 19$^{th}$ Annual BACUS Symposium on Photomask Technology, pp. 905-915, Sep. 1999.

* cited by examiner

US 7,804,583 B2

EUV RETICLE HANDLING SYSTEM AND METHOD

CROSS REFERENCE TO RELATED APPLICATIONS

This is a continuation of application Ser. No. 11/238,237, filed Sep. 28, 2005, now U.S. Pat. No. 7,477,358 which is incorporated herein by reference. Priority under 35 U.S.C. §119 is claimed based on U.S. Provisional Patent Application No. 60/614,118, filed Sep. 28, 2004, the disclosure of which is expressly incorporated herein by reference.

BACKGROUND

1. Technical Field

Embodiments disclosed herein relate to an apparatus for and method of handling a reticle in a lithography system, such as an extreme ultraviolet lithography ("EUVL") system.

2. Related Art

The need for protection from particulate matter (i.e., dust, dirt, etc.) contaminating objects of interest is required in many fields of application, including applications in semiconductor manufacturing such as microlithography. As microprocessors become faster and more powerful, an ever increasing number of transistors are required to be positioned on a semiconductor chip. The increased transistor density necessitates closer placement of the transistors, smaller device sizes, and interconnects that take less space. An ever increasing accuracy and precision in the methods for laying down the circuits on the chip is therefore required.

To achieve such great circuit density, the exposure radiation wavelengths used in microlithography are decreasing from visible to VUV, EUV, and smaller in next generation lithography ("NGL") tools. A reticle with a desired pattern on one side is illuminated by the radiation, and the radiation transfers an image of the pattern to the substrate to create a part of the desired circuit.

Conventional reticles are typically for use with longer wavelength exposure radiation. As a result, a clear faceplate, called a pellicle, can be utilized to cover and protect the pattern side of a reticle. As the features grow smaller, resulting in the need for shorter wavelengths, e.g. EUV radiation, the pellicle can not be utilized as present materials absorb too much of the radiation for process efficiency and deteriorate quickly. Moreover, the distortion of a reticle has a greater impact on process yields with shorter wavelength radiation, making the flatness of the reticle critical. Therefore, protecting both the pattern side and the side of the reticle used to mount it in a lithography system from contamination (and thus physical distortion) becomes important. Therefore, there is a need to provide reticles and an apparatus for handling reticles to minimize contamination and warping. This need exists throughout the reticle lifetime following final cleaning and inspection.

SUMMARY

As broadly described herein, embodiments according to the invention can include a reticle enclosure, a reticle, a thermophoretic protection system, and an extreme ultra violet lithography system.

A reticle enclosure according to some embodiments of the invention can include a first part having a first contact surface and a second part having a second contact surface. The first and second part form an enclosed space between them to enclose a reticle when the first contact surface is in contact with the second contact surface. At least one of the first and second parts also includes at least one support structure to position a reticle to be enclosed with a gap between the reticle to be enclosed and the first and second part. The reticle enclosure can also include a heater attached to one of the first and second parts and electrically connected to electrical connections on the outside of the enclosure.

A reticle enclosure according to some embodiments of the invention can include a first part having a first contact surface and a second part having a second contact surface. The first and second part form an enclosed space between them to enclose a reticle when the first contact surface is in contact with the second contact surface. At least one of the first and second part also includes at least one support structure to position a reticle to be enclosed with a gap between the reticle to be enclosed and the first and second part. The reticle enclosure also includes one or more optical fiber to direct homogenized light from a laser diode array onto a reticle enclosed with the space.

A reticle for use in a thermophoretic protection system according to some embodiments of the invention has at least one side wall and a resistive heater attached to the at least one side wall. The reticle also includes electrical contact points to allow electricity to power the resistive heater attached to the reticle.

A thermophoretic protection system for a reticle according to some embodiments of the invention can include a reticle to be protected by thermophoresis, a reticle enclosure having a first and second part, a heat sink for each of the first and second part to remove heat, at least one heater to heat the reticle, and a gas between the reticle and the enclosure.

An EUV lithography tool according to some embodiments of the invention can include an exposure chamber, a reticle stage within the exposure chamber, a reticle library, and a reticle enclosure opening and closing station within the exposure chamber. The reticle library includes at least one heat sink having a variable cooling rate to remove heat from at least one reticle enclosure and a supply of electrical power connectable to the at least one reticle enclosure.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments according to some embodiments of the invention and together with the description, serve to explain the principles of the invention. In the drawings.

DETAILED DESCRIPTION

Reference will now be made in detail to exemplary embodiments according to some embodiments of the invention, which are illustrated in the accompanying drawings. Wherever possible, the same reference numbers will be used throughout the drawings to refer to the same or like parts.

Figure 1:
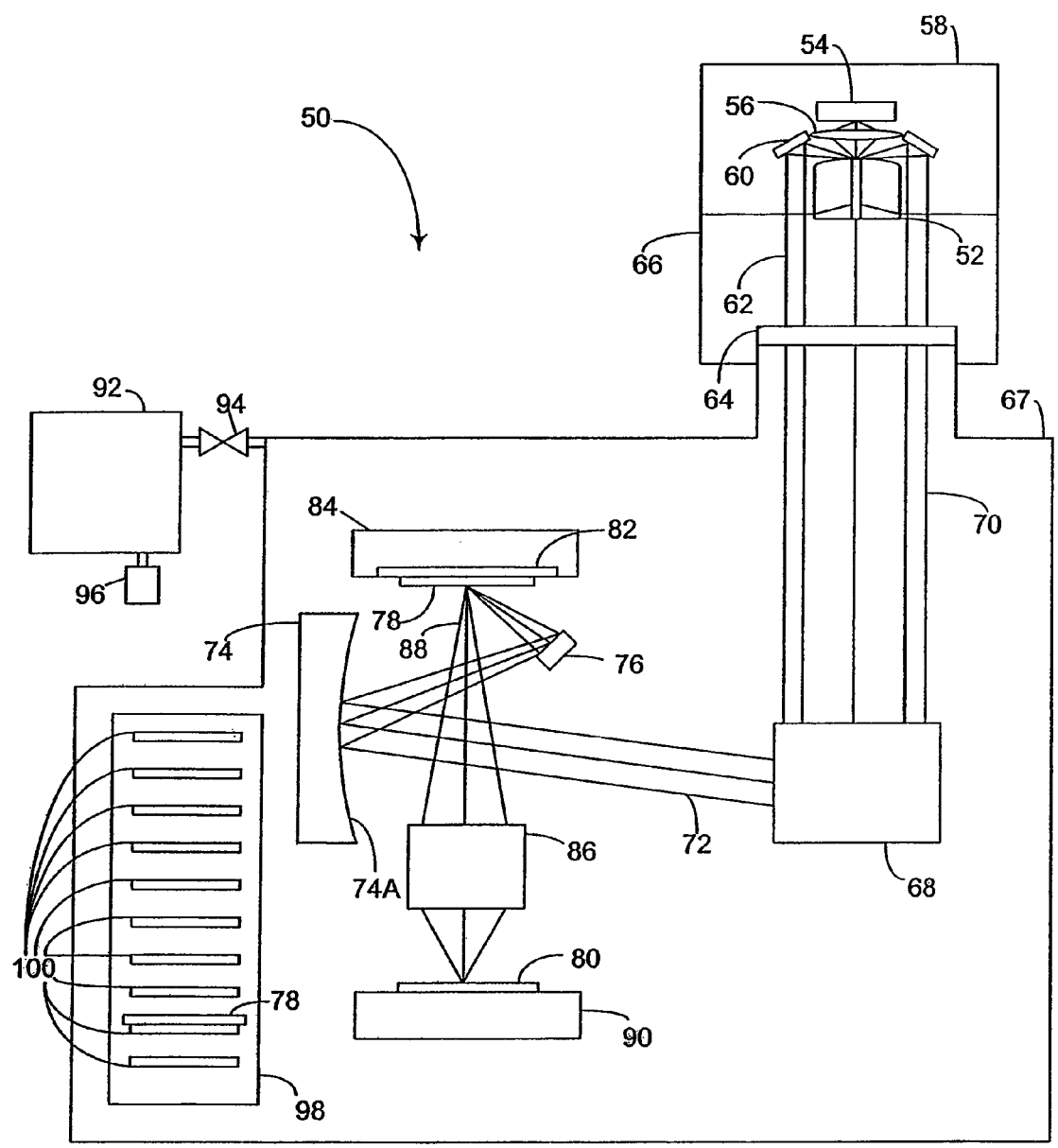
FIG. 1 illustrates an extreme ultraviolet lithography ("EUVL") system needing a particle contamination protection system for use in handling reticles.

Referring to wafer processing equipment, FIG. 1 illustrates a EUV (or soft-X-ray "SXR") lithographic exposure system 50. The depicted system is configured to perform microlithographic exposures in a step-and-scan manner. The depicted system is a projection-exposure system that performs step-and-scan lithographic exposures using light in the extreme ultraviolet ("soft X-ray") band, typically having a wavelength λ in the range of λ≈11-14 nm (nominally 13 nm). Lithographic exposure involves directing an EUV illumination beam to a pattern-defining reticle 78. The illumination beam reflects from reticle 78 while acquiring an aerial image of the pattern portion defined in the illuminated portion of reticle 78. The resulting "patterned beam" is directed to an exposure-sensitive substrate 80, on which a latent image of the pattern is formed.

The EUV beam can be produced by a laser-plasma source 52 excited by a laser 54 situated at the most upper end of the depicted system 50. Laser 54 generates laser light at a wavelength within the range of near-infrared to visible. For example, laser 54 can be a YAG or an excimer laser. Laser light emitted from laser 54 is condensed by a condensing optical system 56 and directed to downstream laser-plasma source 52.

A nozzle (not shown), disposed in laser-plasma light source 52, discharges xenon gas. As the xenon gas is discharged from the nozzle in laser-plasma light source 52, the gas is irradiated by the high-intensity laser light from the condensing optical system 56. The resulting intense irradiation of the xenon gas causes sufficient heating of the gas to generate a plasma. Subsequent return of Xe molecules to a low-energy state results in the emission of SXR (EUV) radiation with good efficiency having a wavelength of approximately 13 nm.

Since EUV light has low transmissivity in air, its propagation path preferably is enclosed in a vacuum environment produced in a vacuum chamber 58. Also, since debris tends to be produced in the environment of the nozzle from which the xenon gas is discharged, vacuum chamber 58 desirably is separate from other chambers of system 50.

A paraboloid mirror 60, provided with, for example, a surficial multi-layer Mo/Si coating, is disposed relative to laser-plasma source 52 so as to receive EUV light radiating from laser plasma source 52 and to reflect the EUV light in a downstream direction as a collimated beam 62. The multi-layer film on parabolic mirror 60 is configured to have high reflectivity for EUV light of which λ≈13 nm.

Collimated beam 62 passes through a visible-light—blocking filter 64 situated downstream of the parabolic mirror 60. By way of example, filter 64 can be made of zirconium (Zr), with a thickness of about 100 nm. Of the EUV radiation 62 reflected by parabolic mirror 60, only the desired 13 nm wavelength radiation passes through filter 64. Filter 64 may be contained in a vacuum chamber 66 evacuated to high vacuum.

An exposure chamber 67 can be situated downstream of filter 64. Exposure chamber 67 contains an illumination-optical system 68 that comprises at least a condenser-type mirror and a fly-eye-type mirror (not shown, but well understood in the art). Illumination-optical system 68 also is configured to trim EUV beam 70 (propagating from filter 64) to have an arc-shaped transverse profile. Shaped "illumination beam" 72 is irradiated toward the left in FIG. 1 and is received by mirror 74.

Mirror 74 has a circular, concave reflective surface 74A and is held in a vertical orientation (in the figure) by holding members (not shown). Mirror 74 can be formed from a substrate made, e.g., of quartz or low-thermal-expansion material such as Zerodur (Schott). Reflective surface 74A is shaped with extremely high accuracy and coated with a Mo/Si multi-layer film that is highly reflective to EUV light. Whenever EUV light having a wavelength in the range of 10 to 15 nm is used, the multi-layer film on surface 74A can include a material such as ruthenium (Ru) or rhodium (Rh). Other candidate materials are silicon, beryllium (Be), and carbon tetraboride ($B_4C$).

A bending mirror 76 is disposed at an angle relative to mirror 74, and is shown to the right of mirror 74 in FIG. 1. Reflective reticle 78, that defines a pattern to be transferred lithographically to the substrate 80, is situated "above" bending mirror 76. Note that reticle 78 is oriented horizontally with a reflective surface directed downward to avoid deposition of any debris on the patterned surface of reticle 78. Illumination beam 72 of EUV light emitted from illumination-optical system 68 is reflected and focused by mirror 74 and reaches the reflective surface of reticle 78 via bending mirror 76.

Reticle 78 typically has an EUV-reflective surface configured as a multi-layer film. Pattern elements, corresponding to pattern elements to be transferred to the substrate (or "wafer") 80, are defined on or in the EUV-reflective surface. Reticle 78 can be mounted via a reticle chuck 82 on a reticle stage 84 that is operable to hold and position reticle 78 in at least the X- and Y-axis directions as required for proper alignment of reticle 78 relative to the substrate 80 for accurate exposure. Reticle stage 84 can, in some embodiments, be operable to rotate reticle 78 as required about the Z-axis. The position of reticle stage 84 is detected interferometrically in a manner known in the art. Hence, illumination beam 72 reflected by bending mirror 76 is incident at a desired location on the reflective surface of reticle 78.

A projection-optical system 86 and substrate 80 are disposed downstream of reticle 78. Projection-optical system 86 can include several EUV-reflective mirrors and blinds, shutters, or apertures. Patterned beam 88 from reticle 78, carrying an aerial image of the illuminated portion of reticle 78, can be "reduced" (demagnified) by a desired factor (e.g., ¼) by projection-optical system 86 and is focused on the surface of substrate 80, thereby forming an image of the illuminated portion of the pattern on substrate 80. So as to be imprinted with the image carried by patterned beam 88, the upstream-facing surface of the substrate 80 can be coated with a suitable resist.

Substrate 80 may be mounted by electrostatic attraction or other appropriate mounting force via a substrate "chuck" (not shown but well understood in the art) to a substrate stage 90. Substrate stage 90 is configured to move the substrate chuck (with attached substrate) in the X-direction, Y-direction, and theta Z (rotation about the Z axis) direction relative to the projection-optical system 86, in addition to the three vertical DOF as described in conjunction with the z actuators as described and claimed in U.S. Provisional Application No. 60/625,420, which is incorporated herein by reference in its entirety for all purposes. Desirably, substrate stage 90 is mounted on and supported by vibration-attenuation devices. The position of the substrate stage 90 is detected interferometrically, in a manner known in the art.

A pre-exhaust chamber 92 (load-lock chamber) is connected to exposure chamber 67 by a gate valve 94. A vacuum pump 96 is connected to pre-exhaust chamber 92 and serves to form a vacuum environment inside pre-exhaust chamber 92.

During a lithographic exposure performed using the system shown in FIG. 1, EUV light 72 is directed by illumination-optical system 68 onto a selected region of the reflective surface of reticle 78. As exposure progresses, reticle 78 and substrate 80 are scanned synchronously (by their respective stages 84, 90) relative to projection-optical system 86 at a specified velocity ratio determined by the demagnification ratio of projection-optical system 86. Normally, because not all of the pattern defined by reticle 78 can be transferred in one "shot," successive portions of the pattern, as defined on reticle 78, are transferred to corresponding shot fields on substrate 80 in a step-and-scan manner. By way of example, a 25 mm×25 mm square chip can be exposed on substrate 80 with an IC pattern having a 0.07 μm line spacing at the resist on substrate 80.

Coordinated and controlled operation of system 50 is achieved using a controller (not shown, but typically mounted below system 50 in the "sub-fab" area) coupled to various components of system 50 such as illumination-optical system 68, reticle stage 84, projection-optical system 86, and substrate stage 90. For example, the controller operates to optimize the exposure dose on substrate 80 based on control data produced and routed to the controller from the various components to which the controller is connected, including various sensors and detectors (not shown).

As substrate 80 is further processed, other desired patterns may need to be transferred to it. In this case, reticle 78 may be removed and stored within lithography system 50 in a reticle (mask) library 98. Reticle library 98 has supports 100 for multiple reticles 78 to be stored in close proximity to reticle stage 84.

Figure 2:
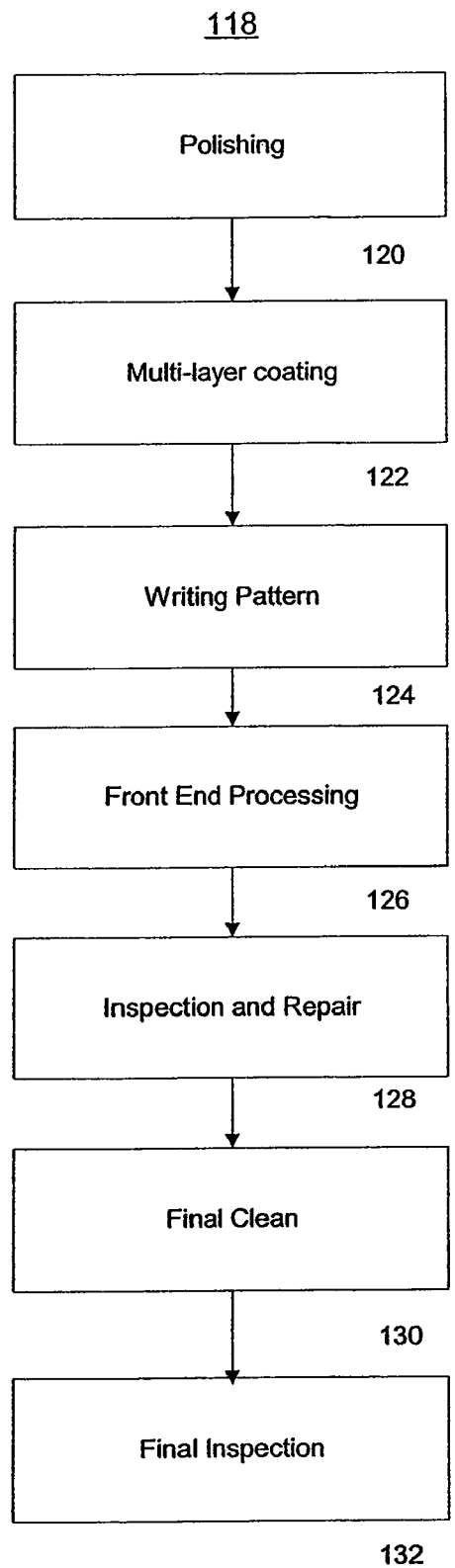
FIG. 2 is a flow chart of a process for manufacturing reticles.

FIG. 2 is a block diagram of an exemplary manufacturing process 118 of a reticle 78. In some embodiments, the reticle substrate, which may be made of ULE™ or equivalent type of low-expansion glass is polished in step 120. The polished reticle substrate then has a multi layer coating of Si, Mo, Ru, TaN, or Cr applied to it in step 122. The reticle substrate with multi-layer coating then is exposed to a writing pattern in step 124. The reticle substrate is then front end processed in step 126. The reticle is then inspected and repaired, if necessary and possible, in step 128. Those reticles that pass step 128 are then cleaned in step 130. Reticle 78 then undergoes another inspection in step 132 before being shipped and stored for use in exemplary lithography system 50.

Protecting the patterns on reticle 78 is critical, because damage to the pattern, or the presence of particulate matter on the pattern side of reticle 78 changes the pattern transferred to substrate 80, therefore creating errors and lowering the yield of the process. In conventional lithography systems (those that use visible light or "G-Line" 436 nm, "I-Line" 365 nm, "KrF" 248 nm, "ArF" 193 nm), reticles 78 are protected by a clear faceplate called a pellicle (which remains permanently attached to the reticle). Particles that fall on the pellicle are outside of the depth of focus of the lithography system and do not interfere with the imaging process. Moreover the pellicle can be periodically cleaned without damaging the reticle.

However, in next generation lithography (NGL) systems, for example, extreme ultraviolet lithography ("EUVL") systems such as that described in FIG. 1, a pellicle cannot be used as it absorbs much of the illumination. The presence of particles on its backside can distort the patterned surface of reticle 78 sufficiently to degrade the process. Therefore, extra care must be taken to ensure that particles to do not migrate to reticle 78. Also in EUVL reticle 78 must be kept very flat when attached to reticle stage chuck 82. Therefore it is also important to prevent relatively large particles, (e.g., 1 μm), or layers of smaller particles from migrating to the backside of reticle 78, which is its chucking surface.

A reticle handling system is used to transfer reticle 78 between reticle stage 84 and a reticle carrier (also called a reticle standard manufacturing interface ("SMIF") pod) or "RSP." Reticle handling systems can be designed to reduce reticle contamination during handling processes. For example, a reticle handling system can be designed to minimize the number of contact events with reticle 78. Ideally, a reticle handling system should not only protect reticle 78 from particles during handling, but should also handle reticle 78 in an efficient manner to improve system productivity. Ideally, a reticle handling system should be as compact as possible to reduce a system footprint to reduce the cost of ownership for a customer.

It should also be noted that where conventional lithography could be achieved in an atmospheric environment, EUVL must be performed in a vacuum environment to reduce optical beam absorption by ambient gases. Therefore, reticle 78 may be handled in a vacuum environment and should be transferred from its RSP (which is at an atmospheric pressure) to a vacuum pressure environment within the lithography tool. EUVL systems therefore pose even greater challenges to minimizing contamination of reticles.

Co-pending international application PCT/US2004/037542 discusses prior concepts for protecting reticles in EUVL systems and is incorporated herein by reference for all purposes. However, we have conceived of improvements to that and equivalent systems to provide a further layer of protection in case of accidental venting of the vacuum-environment while reticle 78 is within the lithography tool and to provide one housing that can protect reticle 78 during handling and during inspection.

Figure 3:
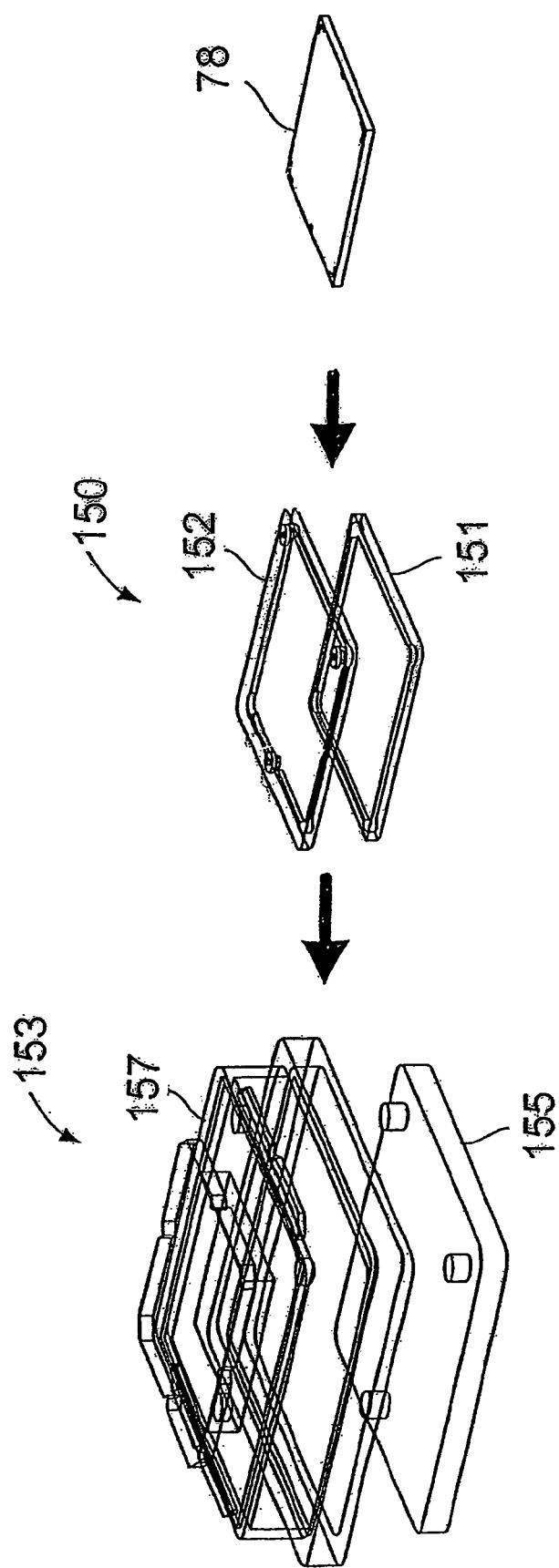
FIG. 3 illustrates an exploded view of a reticle carrier, a "clean filter pod," and a reticle according to some embodiments of the invention.

FIG. 3 illustrates the overall concept of the additional "layer" of protection. In conventional lithography systems a reticle and its attached pellicle are transported from external environments into a load lock where the reticle and pellicle are removed from the reticle carrier and transferred into the exposure chamber. In NGL systems, reticle 78 may be enclosed within a clean filter pod ("CFP") 150 while it is in exposure chamber 67 (see FIG. 1.). CFP 150 with reticle 78 enclosed may be enclosed in Reticle Carrier 153, also known as a reticle standard manufacturing interface ("SMIF") pod, or "RSP" for transportation outside of exposure chamber 67. CFP 150 includes a top part 152 and a bottom part 151. RSP 153 includes a cover 157 and a base 155. CFP 150 is sized to fit within RSP 153.

Figure 4:
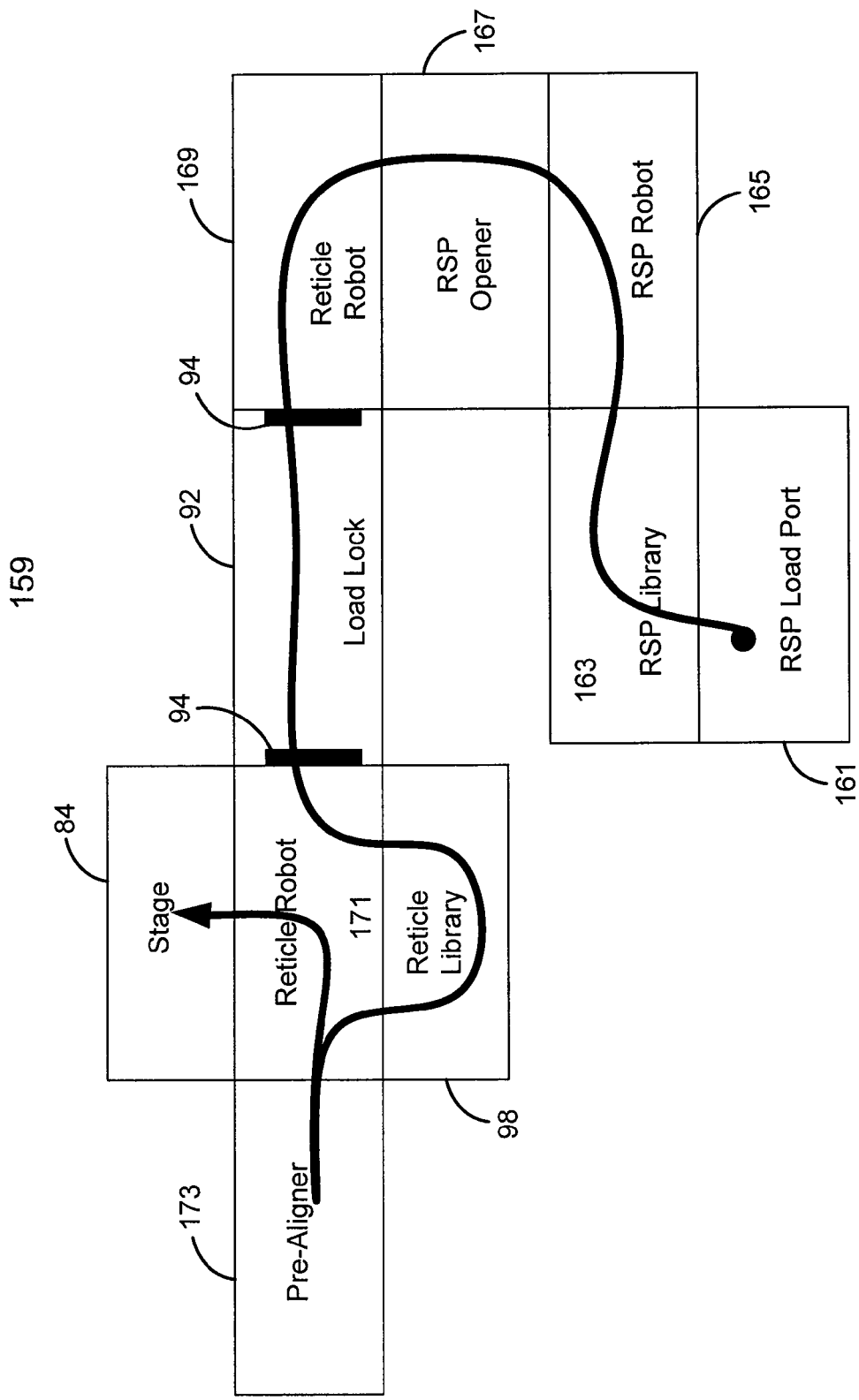
FIG. 4 illustrates a top view of an exemplary EUVL system layout for handling an EUVL reticle according to some embodiments of the invention.

FIG. 4 illustrates a top view of an exemplary layout of stations within a lithographic system 159 according to some embodiments of the invention. In some embodiments, an entry point to system 159 is a RSP pod load port 161. In some embodiments, adjacent to pod load port 161 is a pod library 163. In some embodiments, a pod robot 165 is adjacent to pod library 163 and to a pod opener station 167. In some embodiments, also adjacent to pod opener station 167 is a reticle robot 169. In some embodiments, reticle robot 169 has access to both pod opener station 167 and adjacent load lock 92. In some embodiments, on the opposite side of load lock 92 is another reticle robot 171. In some embodiments, surrounding reticle robot 171 in a clockwise order are a reticle library 98, a pre-aligner 173, and a reticle stage 84.

Figure 5:
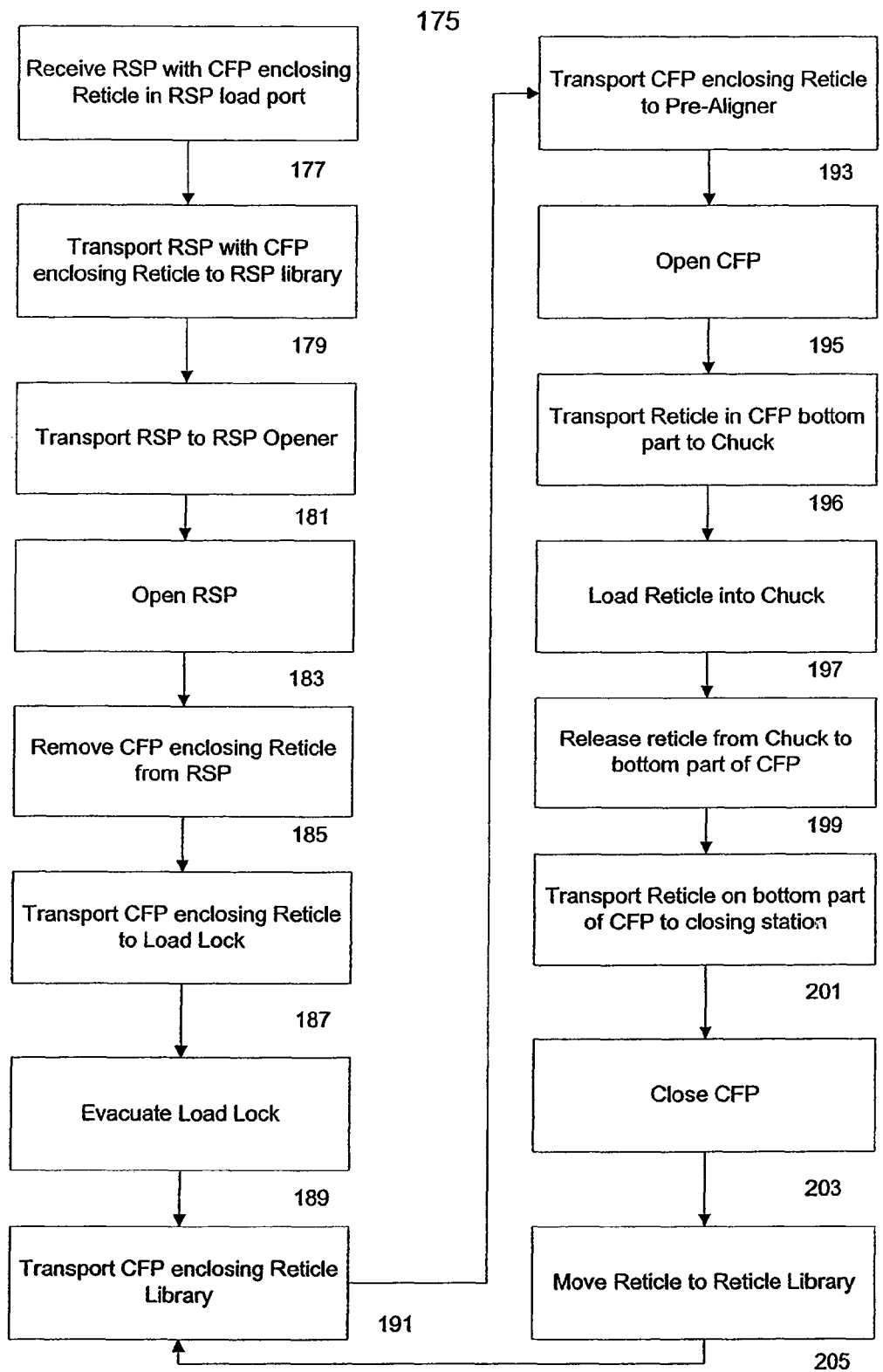
FIG. 5 is a flow chart of an exemplary EUVL handling process of handling an EUVL reticle within a lithography system according to some embodiments of the invention.

FIG. 5 illustrates a flow chart 175 of an exemplary EUVL handling process of handling an EUVL reticle within a lithography system. In some embodiments, in step 177, RSP 153 is received in RSP load port 161. In some embodiments, RSP 153 is placed by RSP load port 161 into RSP library 163 in step 179. In some embodiments, when a particular pattern on a reticle 78 is required, RSP pod robot 165 moves a RSP 153 containing reticle 78 with the particular pattern to pod opener station 167 in step 181 and opens RSP 153 allowing access to CFP 150 in step 183. In some embodiments, after RSP 153 is opened, reticle robot 169 moves CFP 150 from RSP base 155 in step 185 and places it in a load lock 92 in step 187. In some embodiments, steps 177 through 187 may be conducted in atmospheric pressure. In some embodiments, in step 189, load lock 92 may also be sealed and evacuated by a vacuum pump to a desired vacuum pressure. In some embodiments where thermophoretic protection may be contemplated within the exposure chamber, the desired vacuum pressure is 50 millitorr, but an acceptable thermophoretic protection pressure providing is 30 mtorr or greater. In some embodiments, after gate valve 94 opens, reticle robot 171 moves CFP 150 from load lock 92 to reticle library 98 in step 191. In some embodiments, when the particular pattern on reticle 78 is needed, reticle robot 171 moves CFP 150 from reticle library 98 to pre-aligner 173 in step 193. In some embodiments, after being pre-aligned, reticle robot 171 moves CFP 150 to an external shelf (not shown here, but illustrated in FIGS. 7, 8, 14, and 15) to capture top part 152 and semi-passively open CFP 150 in step 195. In some embodiments, bottom part 151 and reticle 78 are then moved to reticle stage 84 in step 196 where reticle 78 is loaded into chuck 82 of reticle stage 84 in step 197. In some embodiments, reticle 78 is then used to transfer a patterned EUV beam onto substrate 80 as discussed in conjunction with FIG. 1. In some embodiments, reticle 78 is then released from chuck 82 in step 199. In some embodiments, reticle robot 171 returns reticle 78 and bottom part 151 to external shelf in step 201 and semi-passively closes CFP 150 in step 203. In some embodiments, finally, CFP 150 with reticle 78 enclosed is returned to reticle library 98 in step 205. Of course, the other steps may be reversed should the reticle need to be removed from the lithography tool for inspection, long term storage, etc.

In some embodiments of a reticle handling system layout and process (not illustrated), RSP pod opener 167 may be combined with load lock 92, reducing the number of times reticle 78 is handled and the footprint of system 159. With a combined RSP pod opener and load lock, a RSP would be transported from its entry point at RSP load port 161 to a pod library 163 to the combined load lock/RSP opener, and CFP 150 would be removed from the RSP base 155 in the combined load lock/RSP opener station.

Other layouts may be envisioned, depending on what process condition must be optimized.

Figure 6:
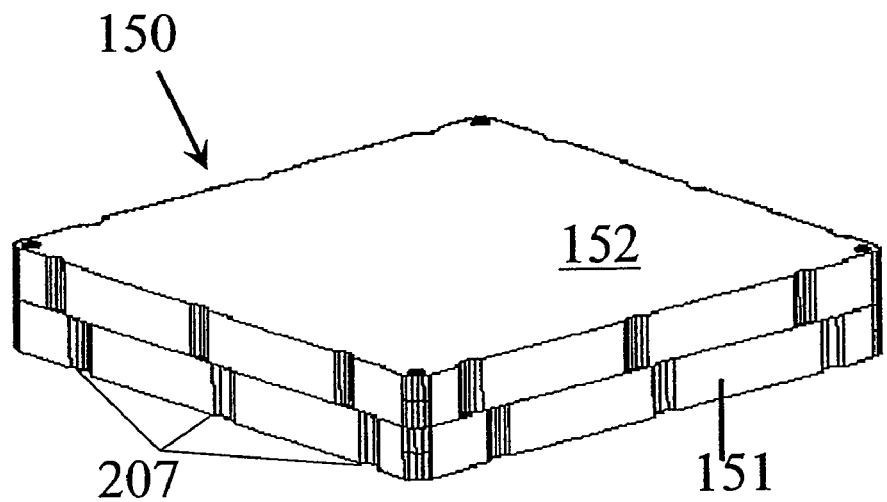
FIG. 6 illustrates a top perspective view of an embodiment of a clean filter pod according to some embodiments of the invention.

FIGS. 6 through 10 illustrate an embodiment of top part 152 and bottom part 151 of CFP 150 according to some embodiments of the invention. FIG. 6 is a perspective view of CFP 150 in the "closed" position. In some embodiments, both top part 152 and bottom part 151 include three cutouts 207 on all side edges. In some embodiments, the three cutouts are not symmetrically placed on the side but are offset. This is done for ease of manufacture and assembly of CFPs. With offset cutouts, if the top and bottom parts are made the same, when assembled, the cutouts will never align.

Figure 7:
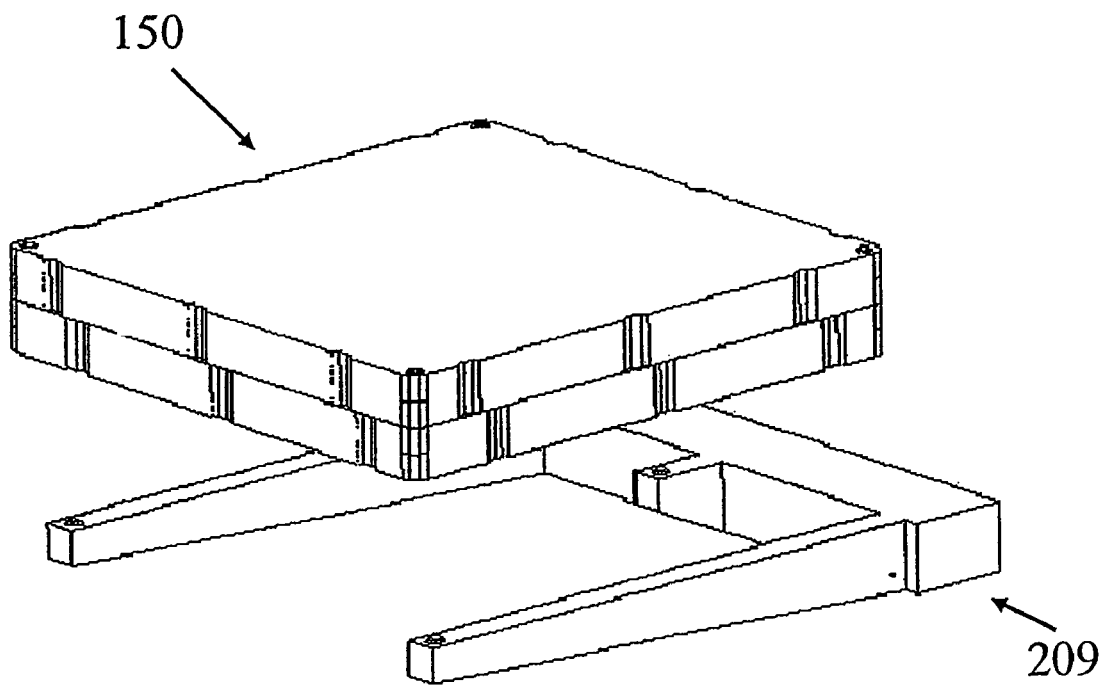
FIG. 7 illustrates an exploded perspective view of the clean filter pod of FIG. 6 and an end effector for moving the clean filter pod.
Figure 8:
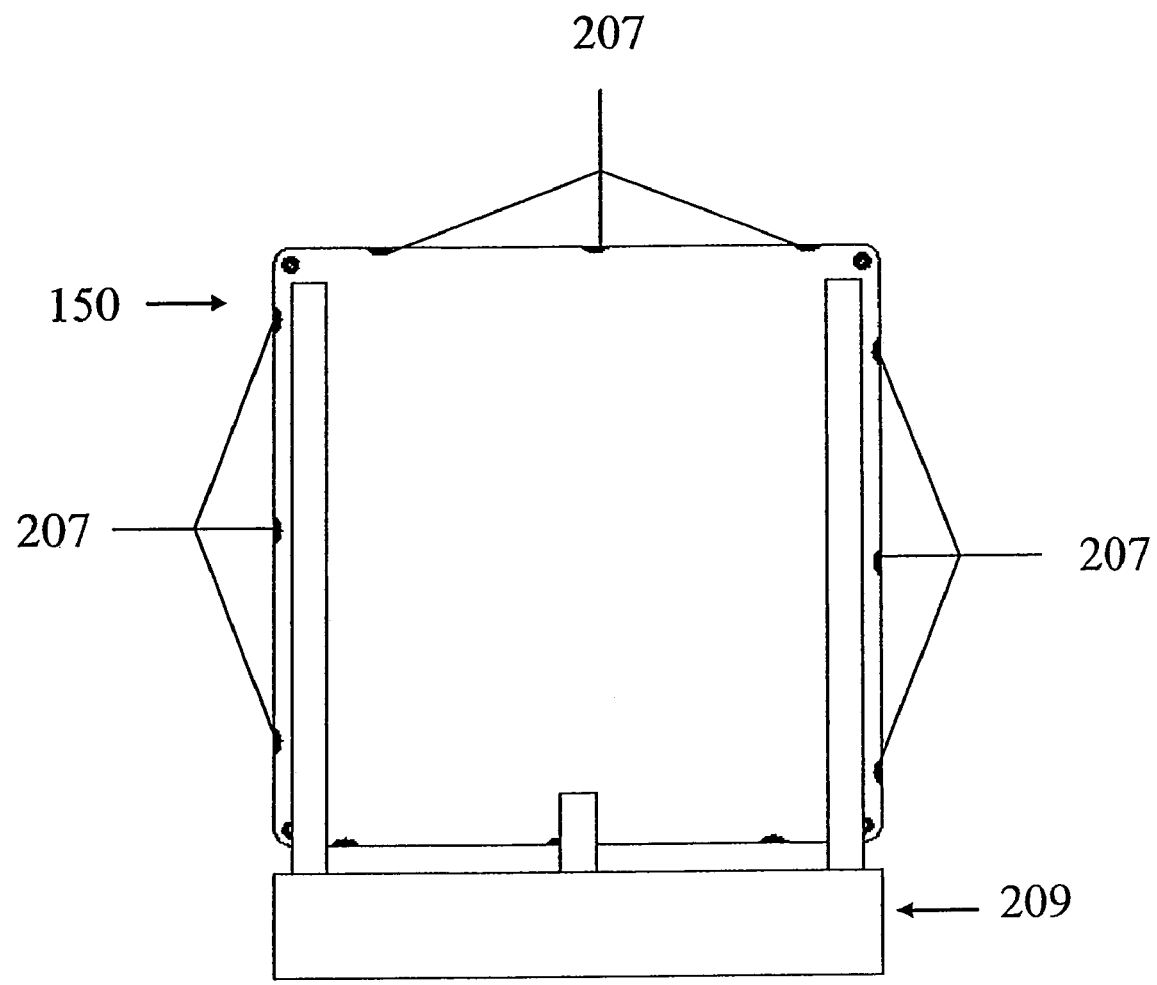
FIG. 8 illustrates a bottom view of the clean filter pod of FIG. 6 and the end effector of FIG. 7 supporting it.
Figure 9:
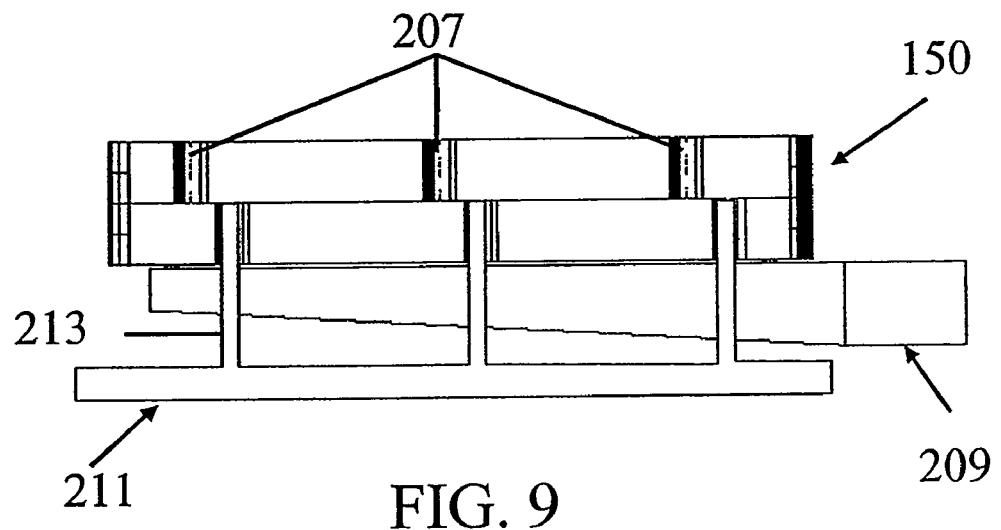
FIG. 9 illustrates a side view of the clean filter pod and end effector of FIG. 7 before passively opening the clean filter pod with an external shelf.
Figure 10:
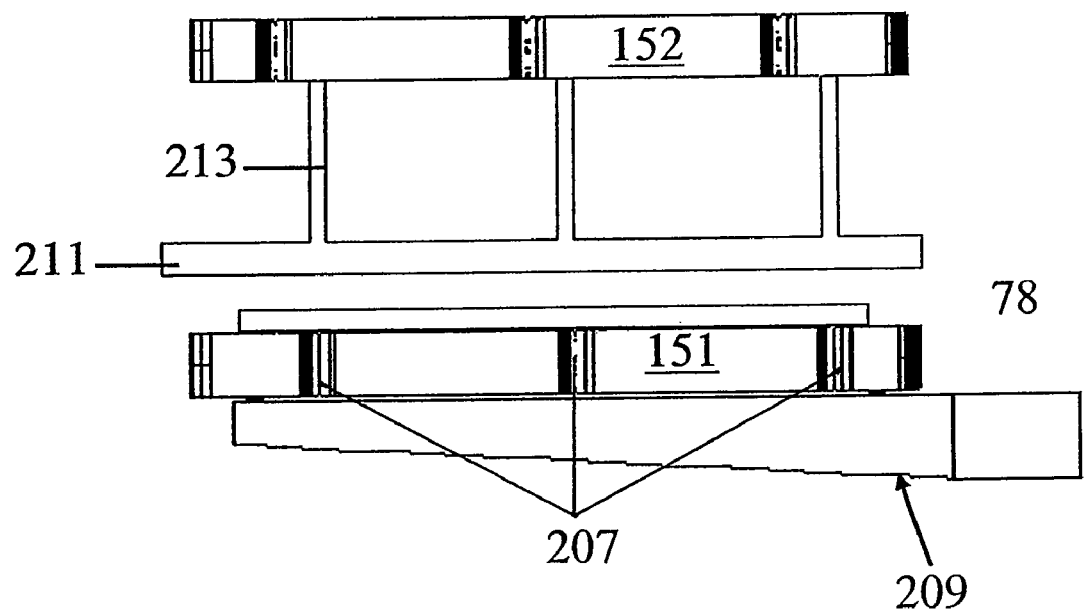
FIG. 10 illustrates a side view of the clean filter pod, end effector, and external shelf of FIG. 9 after the end effector has lowered and passively opened the clean filter pod.
Figure 11:
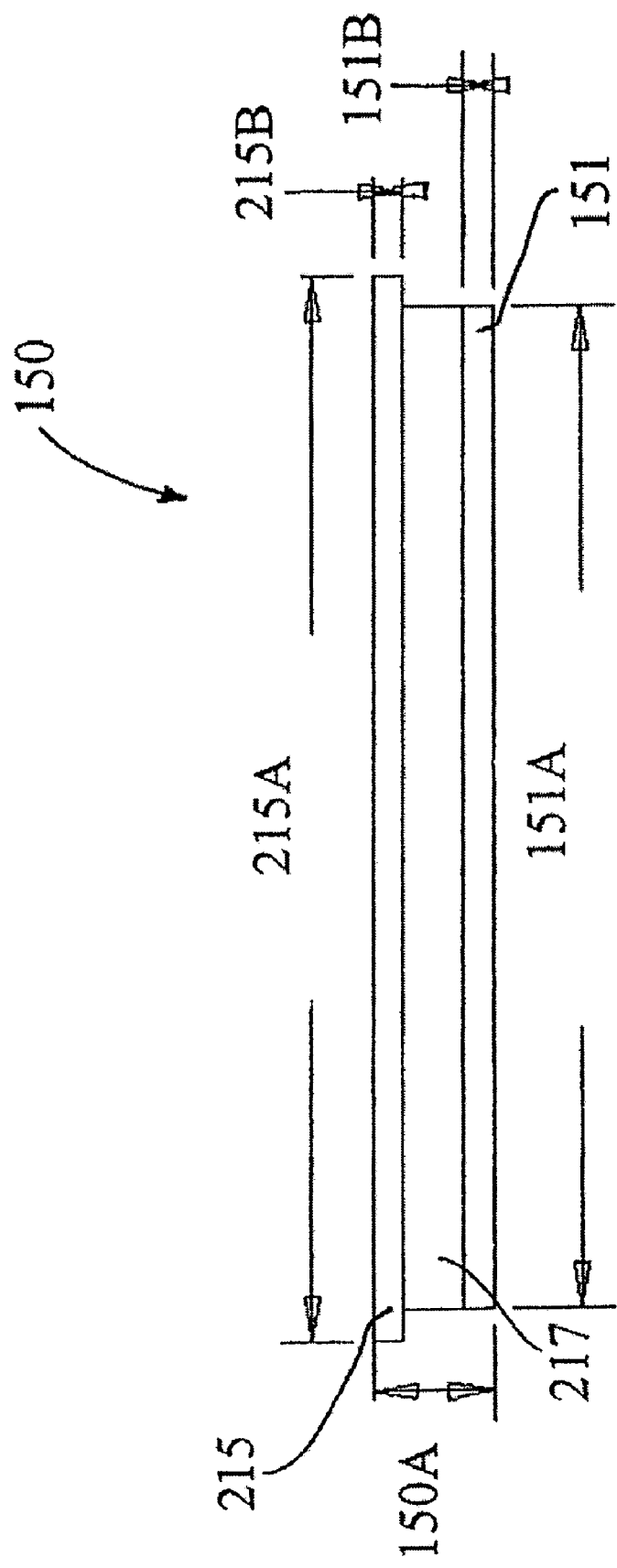
FIG. 11 illustrates a side view of another embodiment of a clean filter pod according to some embodiments of the invention.

FIG. 7 illustrates a CFP 150 as embodied in FIG. 6 in proximity to an end effector 209, which may be used to move CFP 150. As shown in FIG. 8, a bottom view of CFP 150 and end effector 209 illustrates that end effector 209, in some embodiments, is no wider than the width of CFP 150 and is designed to fit underneath and not on the sides of CFP 150. FIG. 9 illustrates the beginning point for semi passively opening CFP 150 with end effector 209 and an external shelf 211. In some embodiments, CFP 150, supported by end effector 209, has three vertical supports 213 of external shelf 211 within cutouts 207 of bottom part 151. In some embodiments, the top surfaces of vertical supports 213 contact a bottom surface of top part 152. In FIG. 10, end effector 209 has lowered bottom part 151, but top part 152 remains in the same location as in FIG. 9, as it is supported by vertical supports 213. In some embodiments, thus, CFP 150 is semi-passively opened exposing reticle 78 as supported by bottom part 151.

Figure 12:
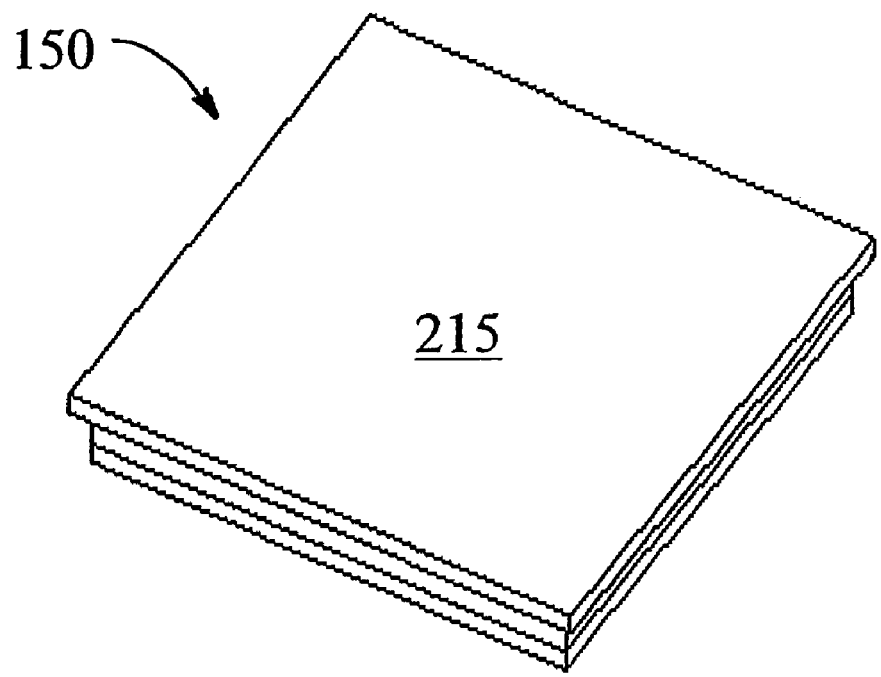
FIG. 12 illustrates a top perspective view of the clean filter pod shown in FIG. 11.
Figure 13:
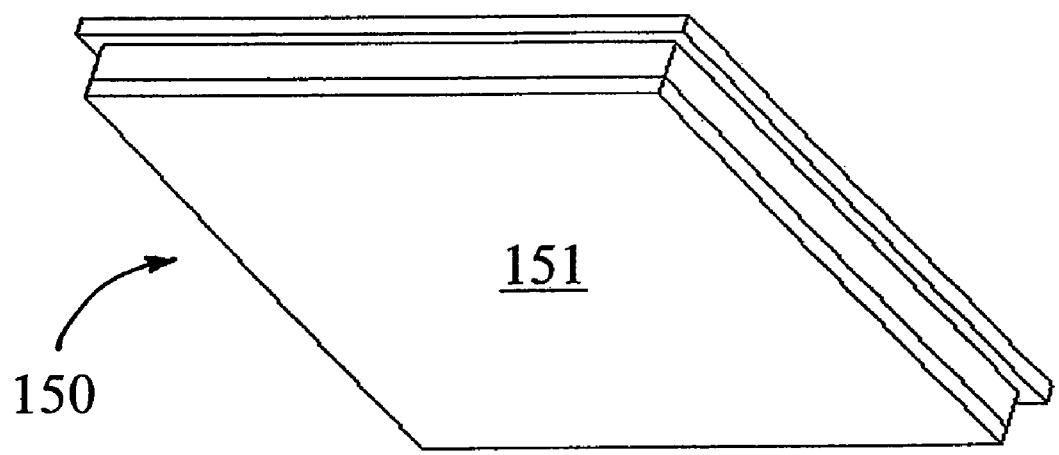
FIG. 13 illustrates a bottom perspective view of the clean filter pod shown in FIG. 11.

FIGS. 11-15 illustrate a second embodiment of CFP 150 according to some embodiments of the invention. In some embodiments, top part 152 includes a larger top piece 215 and a frame 217. In some embodiments, larger top piece 215, is a square of 215A length dimension, and a 215B thickness dimension. Specifically, in some embodiments, larger top piece 215 is 180 mm square by 5 mm thick. In some embodiments, bottom part 151 is a square of 151A dimension and 151B thickness. Specifically, in some embodiments, bottom part 151 is 170 mm square by 5 mm thick. Frame 217, in some embodiments, has the same square dimension as bottom part 151. In some embodiments, the assembled CFP has an overall thickness dimension of 150A. Specifically, in some embodiments, the overall thickness of CFP 150 is 20 mm providing vertical space around at least one side of a reticle, which is typically 6.35 mm thick. FIG. 12 shows a top perspective view of this embodiment of CFP 150. FIG. 13 shows a bottom perspective view of this embodiment of CFP 150.

Figure 14:
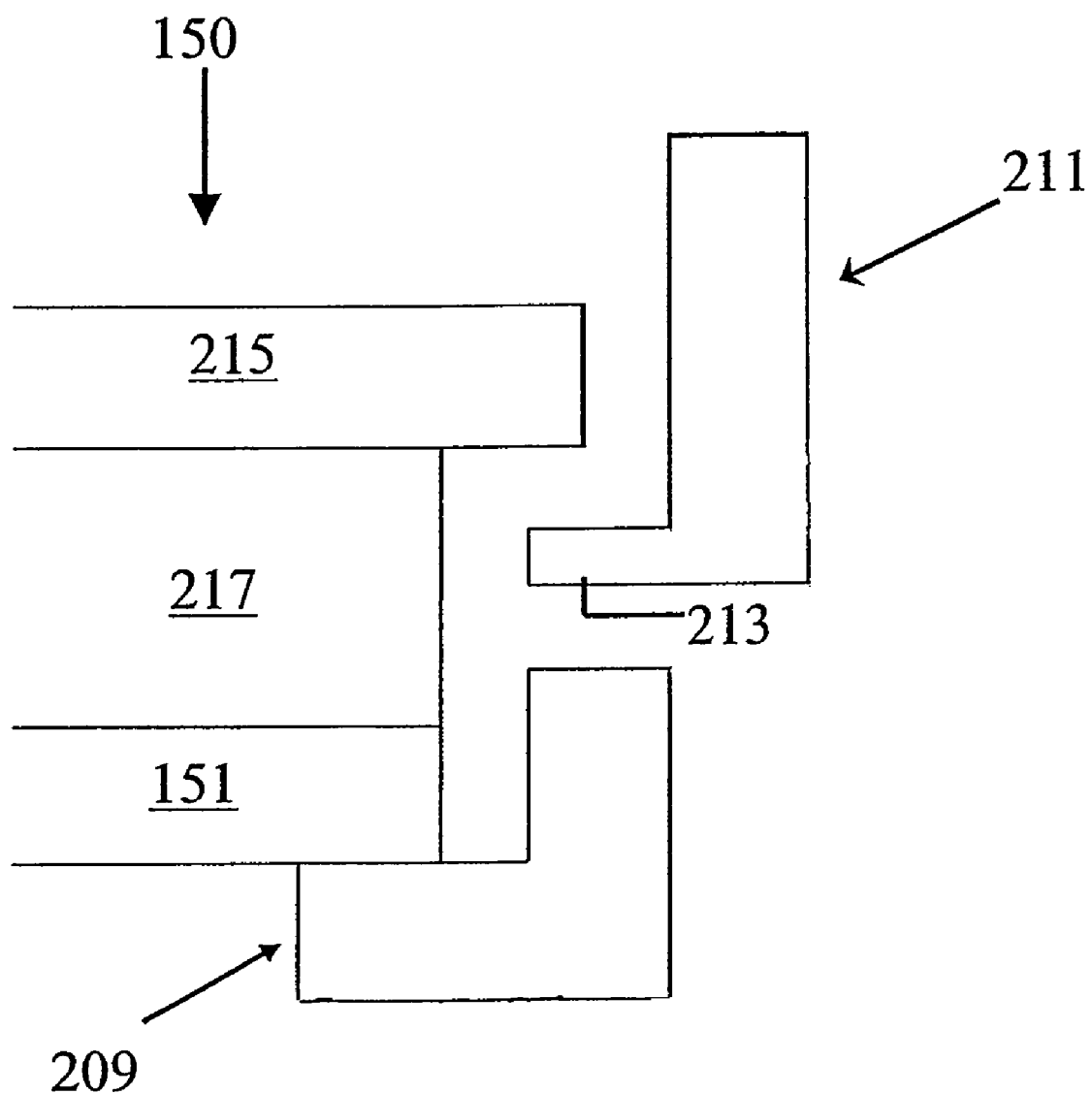
FIG. 14 illustrates an enlarged detail view of the clean filter pod shown in FIGS. 12 and 13 supported by an end effector before it passively opens the clean filter pod with the external shelf.
Figure 15:
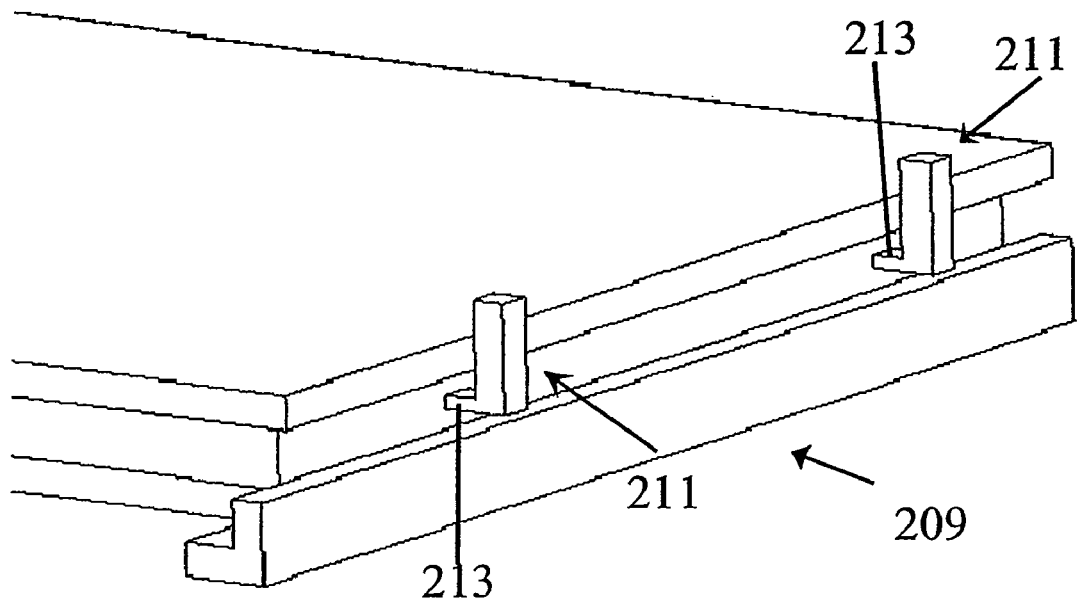
FIG. 15 illustrates a perspective view of the components shown in FIG. 14.

FIGS. 14 and 15 illustrate a detail of the alignment of CFP 150 and another embodiment of end effector 209 and external shelf 211. In some embodiments, CFP 150 is supported by a portion of end effector 209. In some embodiments, end effector 209, in contrast to the embodiment shown in FIGS. 7-10, has a vertical portion that is designed to be near, but not touching, the vertical sides of CFP 150. In some embodiments, external shelf 211 includes a horizontal piece 213 that functions as the vertical support for top part 152. In some embodiments, the top surface of vertical support 213 will come into contact with the bottom surface of the portion of larger top piece 215 that extends beyond the footprint of frame 217 and bottom part 151. In some embodiments, thus, when end effector 209 lowers, top part 152 will rest on vertical supports 213 and bottom part 151 with reticle 78 will separate from top part 152, thus, passively opening CFP 150.

Figure 16:
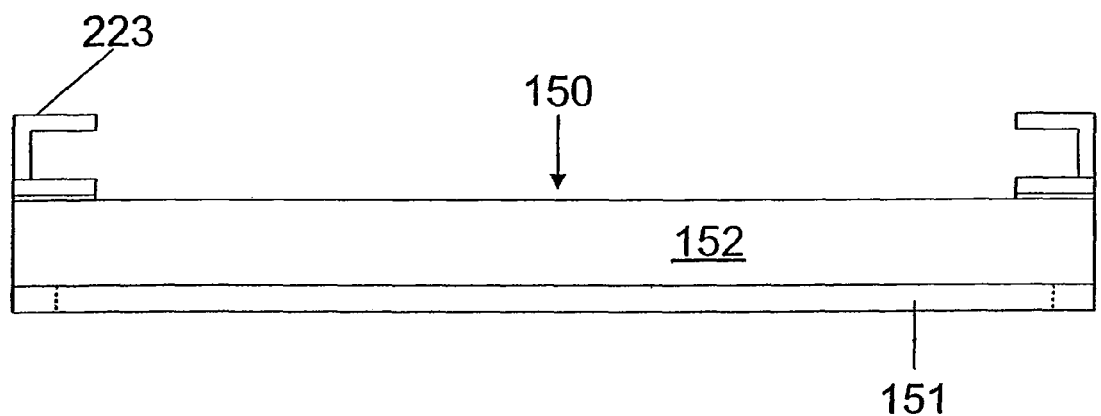
FIG. 16 illustrates a side view of another embodiment of a clean filter pod according to some embodiments of the invention.

FIGS. 16-19 illustrate a third embodiment of CFP 150 according to some embodiments of the invention. FIG. 16 illustrates an embodiment of CFP 150 with hooks 223 attached to top part 152. In some embodiments, hooks 223 are L-shaped pieces with the opening facing in and no part extending beyond the foot print of top part 152. There may be any number of hooks, for example, three. Three hooks, located two on one side at or near the corners, and one in the middle of the opposite side of CFP 150, provide extra stability to top part 152 when it is supported by corresponding vertical supports of external shelf 211.

Figures 17, 18:
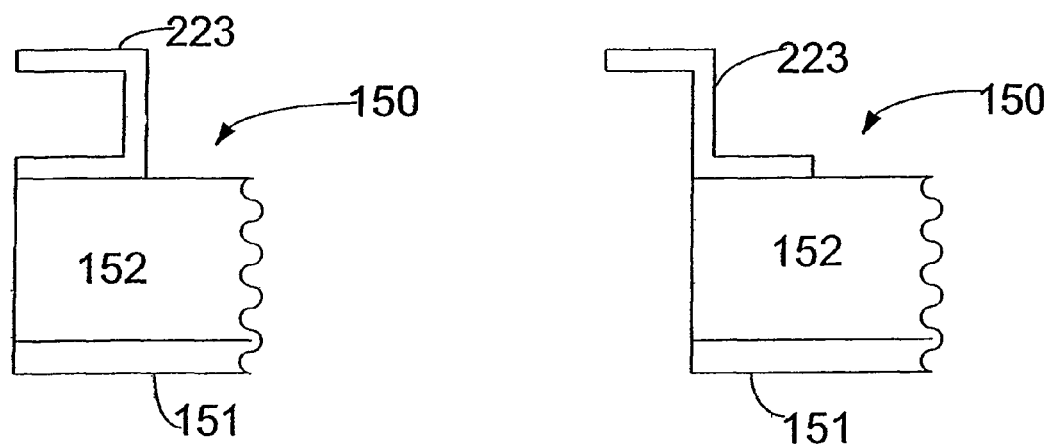
FIG. 17 illustrates a detail of a hook and its location on a clean filter pod according to some embodiments of the invention.
FIG. 18 illustrates a detail of another hook and its location on a clean filter pod according to some embodiments of the invention.

FIGS. 17 and 18 illustrate two variations on locations and orientations of hooks 223 as attached to top part 152. Hook 223 faces with the opening to the outside of CFP 150 in FIG. 17, but still within the footprint of top part 152. Hook 223 faces with the opening to the outside of CFP 150 in FIG. 18, but extends beyond the footprint of top part 152.

Figure 19:
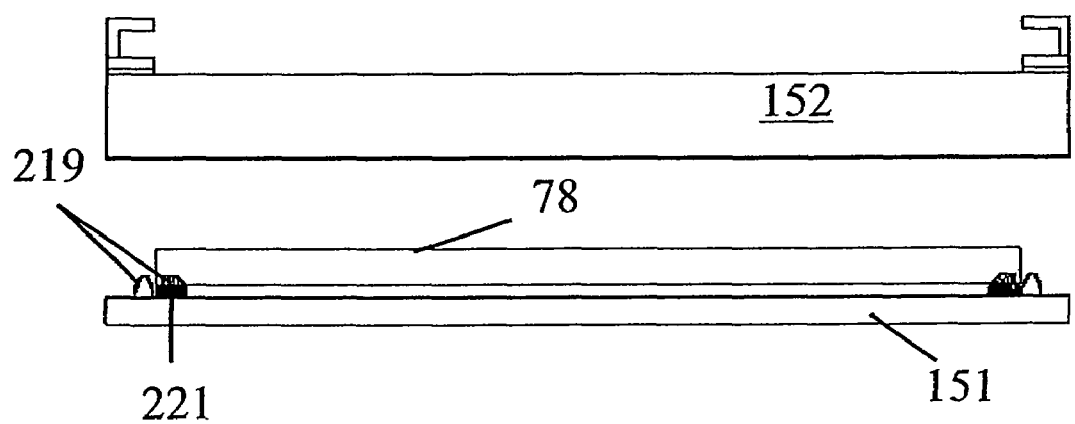
FIG. 19 illustrates a side view of the clean filter pod shown in FIG. 16 open and with a reticle supported by the bottom part.

FIG. 19 illustrates top part 152 as suspended by vertical supports of external shelf 211 (not shown) after end effector 209 (not shown) lowers bottom part 151 with reticle 78. In FIG. 19, reticle 78 is illustrated located with bumpers 219 and standoffs 221 (not shown, but behind bumpers 219). For opening CFP 150, the above mentioned embodiment uses end effector 209 but other mechanical contact can also be used instead of end-effector 290. For example, hook 223 or some similar mechanical structure can be positioned in a pre-alignment stage, reticle library and so on, and at these locations CFP 150 may be opened.

In some embodiments, including all three, above-described embodiments of CFP 150, top part 152 and bottom part 151 may each contain at least a portion through which radiation of a range of wavelengths may pass through to accommodate inspection and measurement of aspects of reticle 78 while it is stored in CFP 150. These include visual inspection, inspection processes using DUV, and on the other end, measurements using infra red ("IR") wavelengths. A material meeting such requirements is quartz. The portion of top part 152 or bottom part 151 comprising such material may vary in dimensions, depending on how much of reticle 78 is desired to be inspected or measured while it is within CFP 150.

Figure 20:
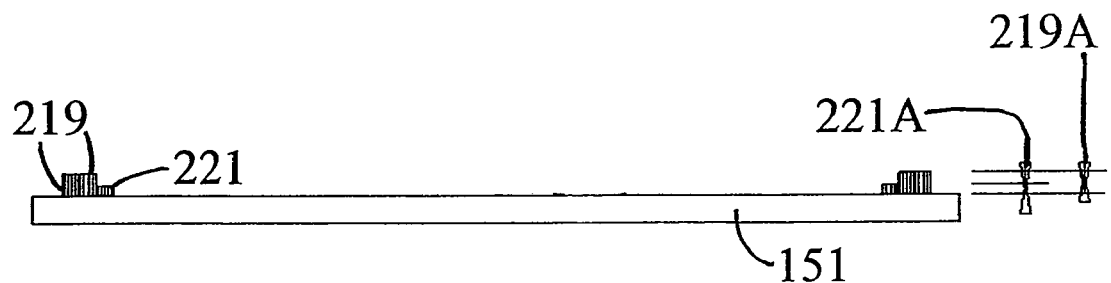
FIG. 20 illustrates a side view of an embodiment of a bottom part of a clean filter pod according to some embodiments of the invention.
Figure 21:
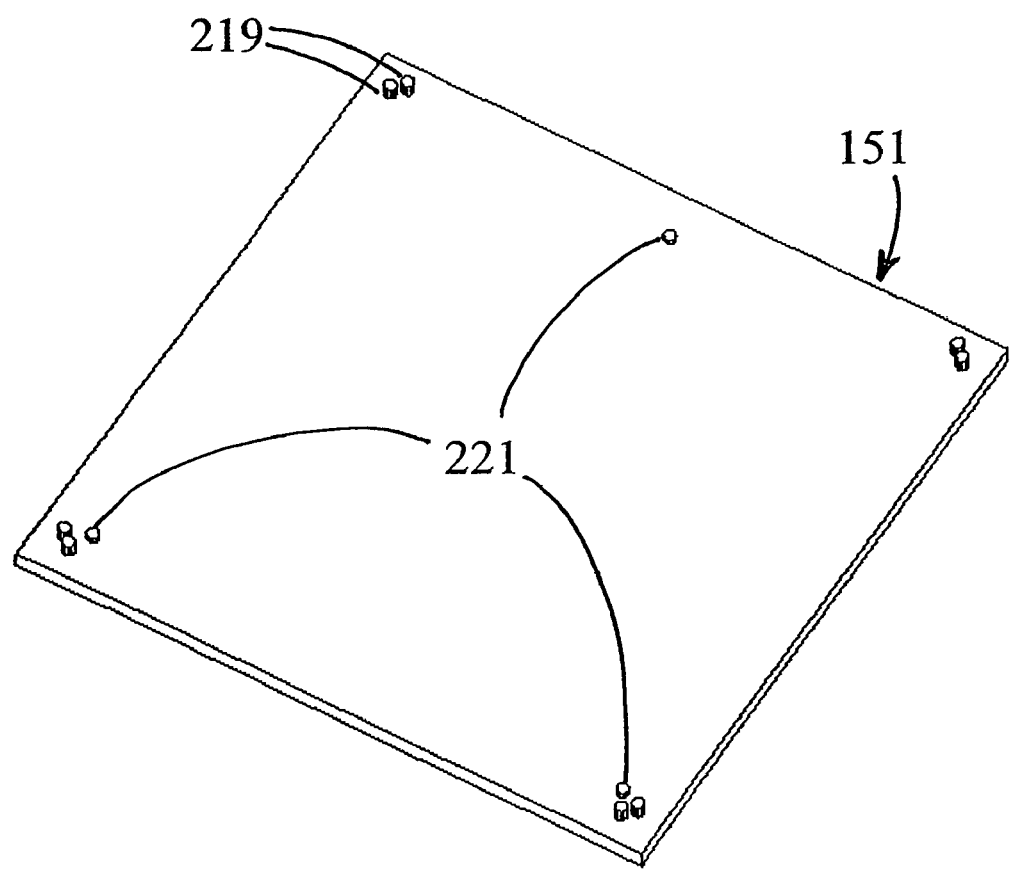
FIG. 21 illustrates a top perspective view of the bottom part shown in FIG. 20.

FIGS. 20 and 21 illustrate further detail on components of bottom part 151. In some embodiments, bottom part 151 generally locates reticle 78 using bumpers 219 and supports reticle 78 using standoffs 221. In some embodiments, bumper 219 stands above the top surface of bottom part 151 a dimension 219A. Specifically, in some embodiments, bumper 219 stands about 4 mm above the top surface of bottom part 151. Standoff 221 stands a dimension 221A from the top surface of bottom part 151. Specifically, in some embodiments, standoff 221 is about 2 mm above the top surface of bottom part 151. FIG. 21 illustrates the location of eight bumpers 219 and three standoffs 221. In some embodiments, two bumpers 219 are located at each corner and define a space between them in which a corner of reticle 78 will fit. In some embodiments, reticle 78 will not contact bumpers 219 unless abnormal handing (an error) occurs. In some embodiments, bumpers 219 may prevent reticle 78 from sliding off of bottom part 151. In some embodiments, bumper 219 may be cylindrical with a flat surface, or a conical or spherical top to assist in locating the corners of reticle 78 when reticle 78 is lowered onto bottom part 151. In some embodiments, reticle 78 is supported in a plane defined by these three standoffs 221. In some embodiments, standoffs 221 may have flat, conical, or spherical tops.

Figure 22:
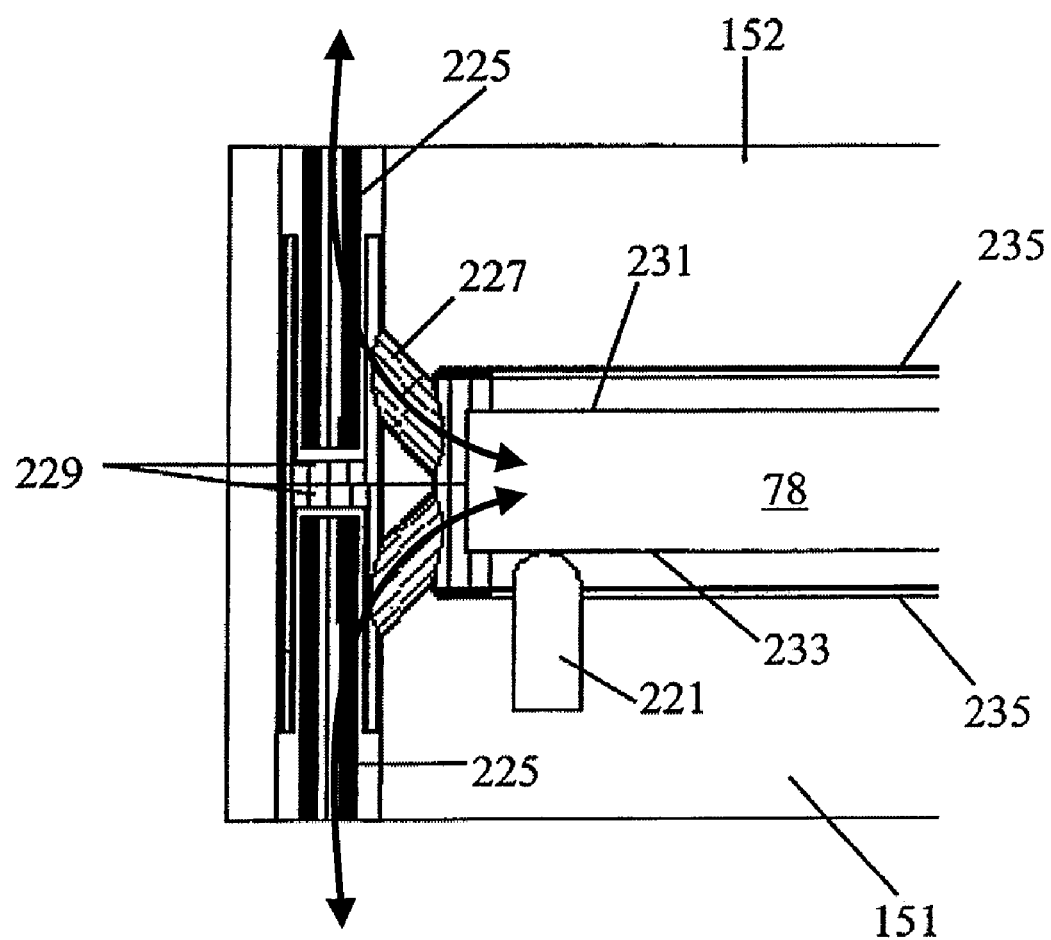
FIG. 22 illustrates a detail of a clean filter pod according to some embodiments of the invention showing an exemplary filter, reticle standoff, sealing surfaces, and reticle and cover coatings.

FIG. 22 illustrates a CFP 150 according to the first embodiment including filter ports 225 and connecting pathways 227 that allow gas flow in the direction of the black arrows to equalize the pressure between the space enclosed by top part 152 and bottom part 151 of CFP 150 and the external environment. Filter ports 225 may be constructed, by way of non-limiting example, of magnetized sintered nickel, electrostatic polypropylene, such as in the G-200 Filtrete™ filter manufactured by 3M, and polycarbonate track etch filters, such as the SPI-Pore™ Filters manufactured by Structure Probe, Inc. In some embodiments, and under some situations, filter ports 225 can provide filtration down to about 30 nm minimal dimensioned particles. In some embodiments, and under some situations, filter ports 225 can provide filtration of down to about 3 nm minimal dimensioned particles. In some embodiments, the surface of top part 152 that contacts the surface of bottom part 151 has a sealing surface 229. The mating surface of bottom part 151 may have a corresponding sealing surface 229. In some embodiments, sealing surfaces 229 are made of magnetized nickel. These surfaces 229 not only attract each other, but also magnetized particles created from contact as described in co-pending U.S. patent application Ser. No. 10/956,606 entitled, Contact Material and System For Ultra-Clean Applications. In some embodiments, a fluouroelastomer, such as sold by Dupont-Dow under the trademark VITON, may also be used.

The top surface of reticle 78 as it is disposed in FIG. 22 is the side that contacts chuck 82 of reticle stage 84, and is also known as the backside of reticle 78. In some embodiments, where the backside of reticle 78 is designed to come in contact with top part 152, it has a coating 231. In some embodiments, coating 231 is magnetized nickel. The bottom surface of reticle 78, as it is disposed in FIG. 22, is the side that holds the pattern that will reflect the EUV beam, and is also known as the frontside of reticle 78. In some embodiments, where the frontside of reticle 78 is designed to come in contact with standoff 221, it has a coating 233.

Also depicted in FIG. 22 is standoff 221. In some embodiments, standoff 221 is constructed of magnetized nickel. In some embodiments, standoff 221 is constructed of a fluouroelastomer, such as sold by Dupont-Dow under the trademark VITON, may also be used. In some embodiments coating 233 may be magnetized nickel, too, or a material that is harder than magnetized nickel and therefore less likely to particulate. An example of such a material is annealed MoSi Multi-layer. Annealing or heating the MoSi multilayer locally with a laser turns the multilayer into molybdenum silicide which is a hard material—harder than nickel. Another material harder than nickel that can be used to coat the front and backside areas (especially the areas that come into contact with portions of CFP 150) is Chromium.

In some embodiments, the inner surfaces of top part 152 and bottom part 151 are coated with a conductive, IR transmissive, optically clear coating 235. In some embodiments, coating 235 can be Indium Tin Oxide, ITO.

Figure 23:
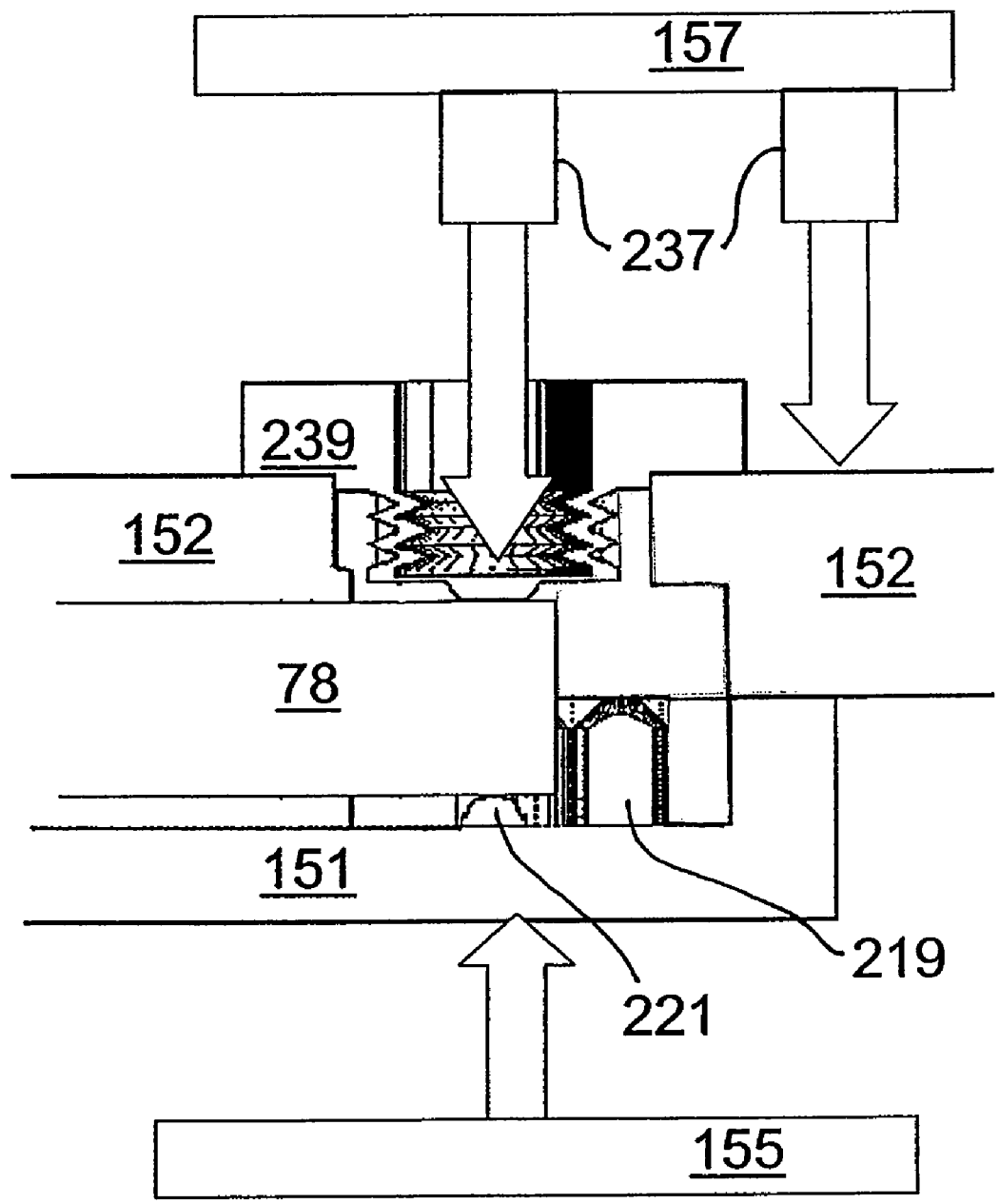
FIG. 23 illustrates a clean filter pod according to some embodiments of the invention with an apparatus for transferring the clamping force from the reticle carrier ("RSP") to both the clean filter pod and the reticle.

FIG. 23 illustrates a detail of a CFP 150 according to some embodiments of the invention. CFP 150 is illustrated, in some embodiments, inside RSP 153. RSP cover 157 and RSP base 155 may be seen. Bottom part 151 of CFP 150 rests either directly on RSP base 155 or indirectly on supports protruding from RSP base 155 (as can be seen in FIG. 3). Reticle 78 may rest on standoffs 221 as previously described and is generally prevented from significant horizontal motion by bumpers 219 as previously described. RSP cover 157 exerts a force, typically, by a spring 237, on top part 152. In FIG. 23 this force is illustrated by a large arrow below spring 237. CFP 150, in some embodiments, also has an apparatus for transferring the clamping force exerted by spring 237 directly on reticle 78, without breaking the seal around reticle 78. In some embodiments, this force is transferred through a bellows 239. In FIG. 23, this force is illustrated by a large arrow below spring 237 and above bellows 239. In some embodiments, bellows 239 is made of magnetized nickel or stainless steel. In some embodiments, bellows 239 may be made of material that does not particulate when flexed. More than one bellows 239 may be utilized to optimize reticle stabilization during expected forces during shipping and other transportation with RSP 153. The use of three bellows 239, located opposite standoffs 221, may provide sufficient restraining forces. The sum of downward forces applied by springs 237 is opposed by a force from RSP base 155. In FIG. 23, this equal and opposite force on CFP bottom part 151 is illustrated by the large arrow pointing upward.

Figure 24:
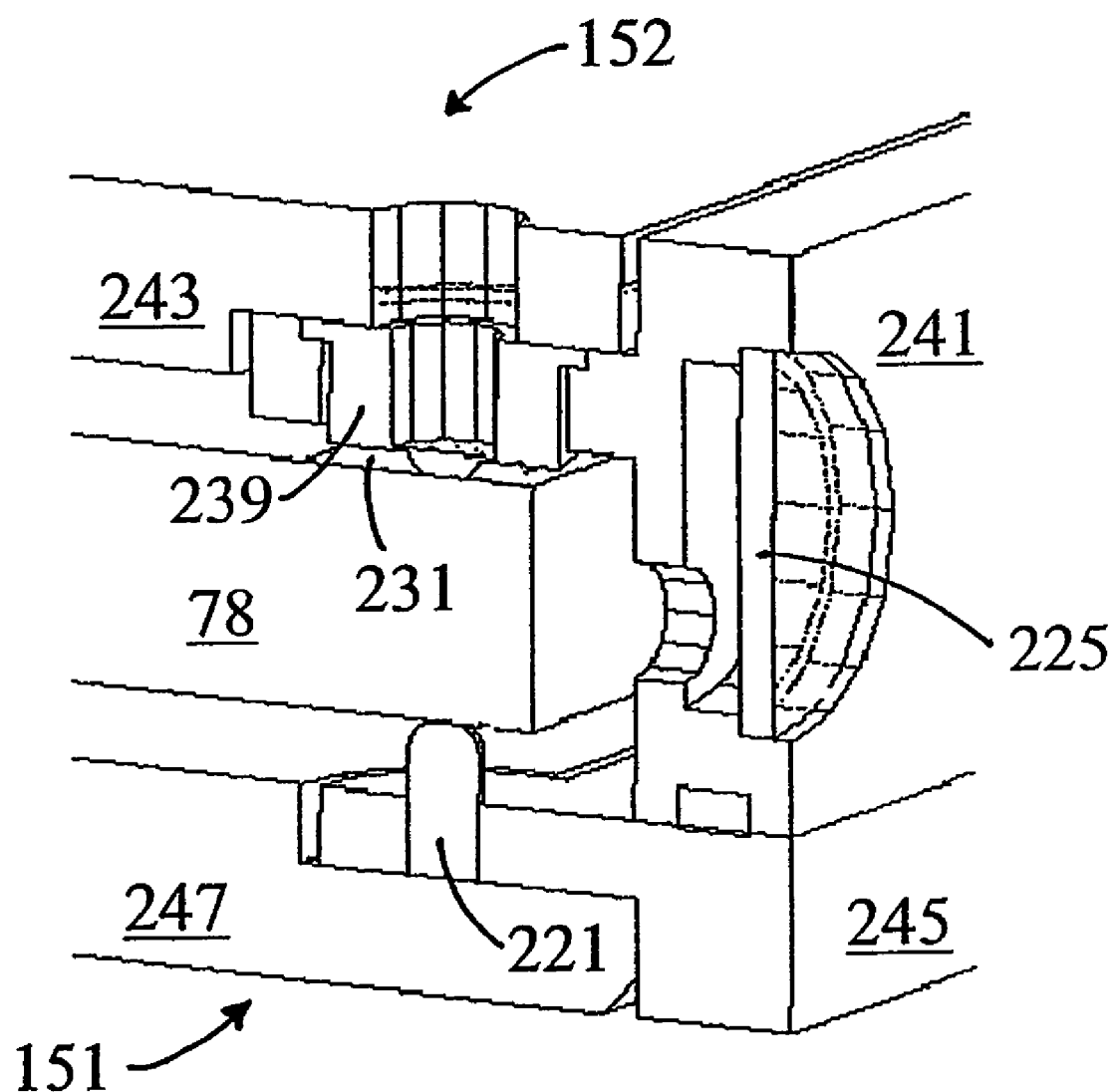
FIG. 24 illustrates a cross section, perspective view of a portion of a clean filter pod according to some embodiments of the invention illustrating exemplary clean filter pod top and bottom constructions, reticle supports, and filters.

FIG. 24 illustrates a detail of a CFP according to some embodiments of the invention. CFP 150 can include a bellows 239 mounted in top part 152, specifically between top frame 241 and top cover 243. In some embodiments, bellows 239 contacts coating 231 on reticle 78. In some embodiments, the portion of bellows 239 that contacts reticle 78 may be constructed of a fluouroelastomer, such as sold by Dupont-Dow under the trademark VITON. In some embodiments, CFP 150 also includes filter 225 mounted within top frame 241. In some embodiments, CFP 150 also includes standoff 221 mounted in bottom part, specifically bottom frame 245 and adjacent to bottom cover 247. In some embodiments, standoff 221 contacts coating 233 (not shown) on reticle 78. Top frame 241 and bottom frame 245, in some embodiments, may be constructed from aluminum. Top cover 243 and bottom cover 247, in some embodiments, may be constructed from optically clear material, such as, for example, quartz. The above embodiment uses CFP 150 for protecting reticle 78 from contamination or particulate matter but other protection devices can be used. For example, only the protection cover positioned to cover the patterned surface of reticle 78, which is the bottom surface of reticle 78 in FIG. 22, can be used. Such a reticle protection cover is shown in U.S. Patent Publication No. US-2003/0218728 and is explicitly incorporated herein by reference for all purposes. Furthermore, the above embodiment secures reticle 78 and reticle protection member or CFP 150 in RSP (Reticle SMIF Pod). However, the loadlock can also have similar securing means and can secure reticle 78 and the reticle protection member (CFP 150 or reticle cover), during an evacuation and pumping procedure. During these processes, the position of reticle 78 or protection member 150 tends to change.

Figure 25:
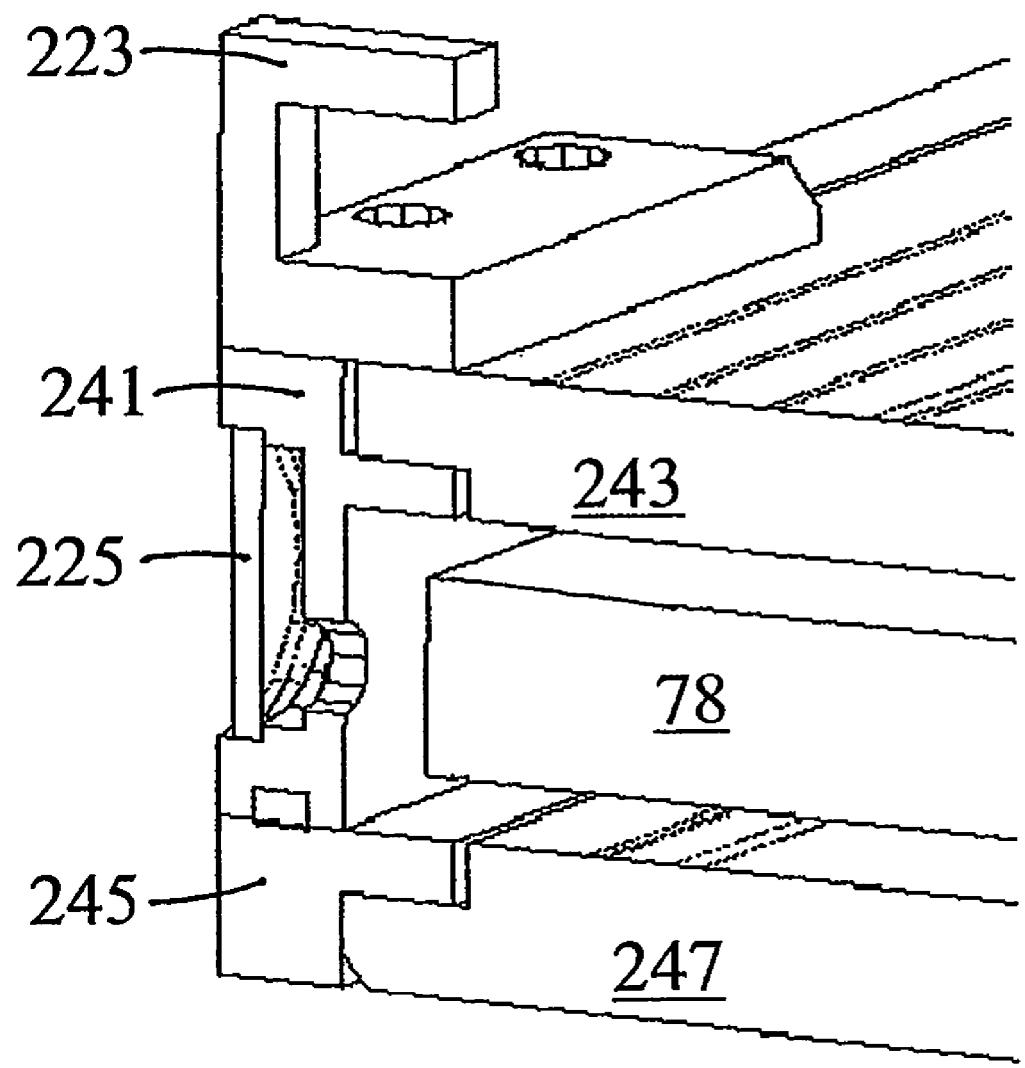
FIG. 25 illustrates a cross-section, perspective view of a portion of a clean filter pod according to some embodiments of the invention illustrating an exemplary opening hook, filter, and clean filter pod top and bottom part construction.

FIG. 25 illustrates a detail of a CFP according to some embodiments of the invention. In some embodiments, CFP 150 includes a hook 223 mounted to top part 152, specifically to frame 241. In some embodiments, top cover 243 can be captured by frame 241 and the base of hook 223. In some embodiments, CFP 150 can include filter 225 mounted in frame 241. In some embodiments, bottom part 151 can include bottom frame 245 and bottom cover 247.

Figure 26:
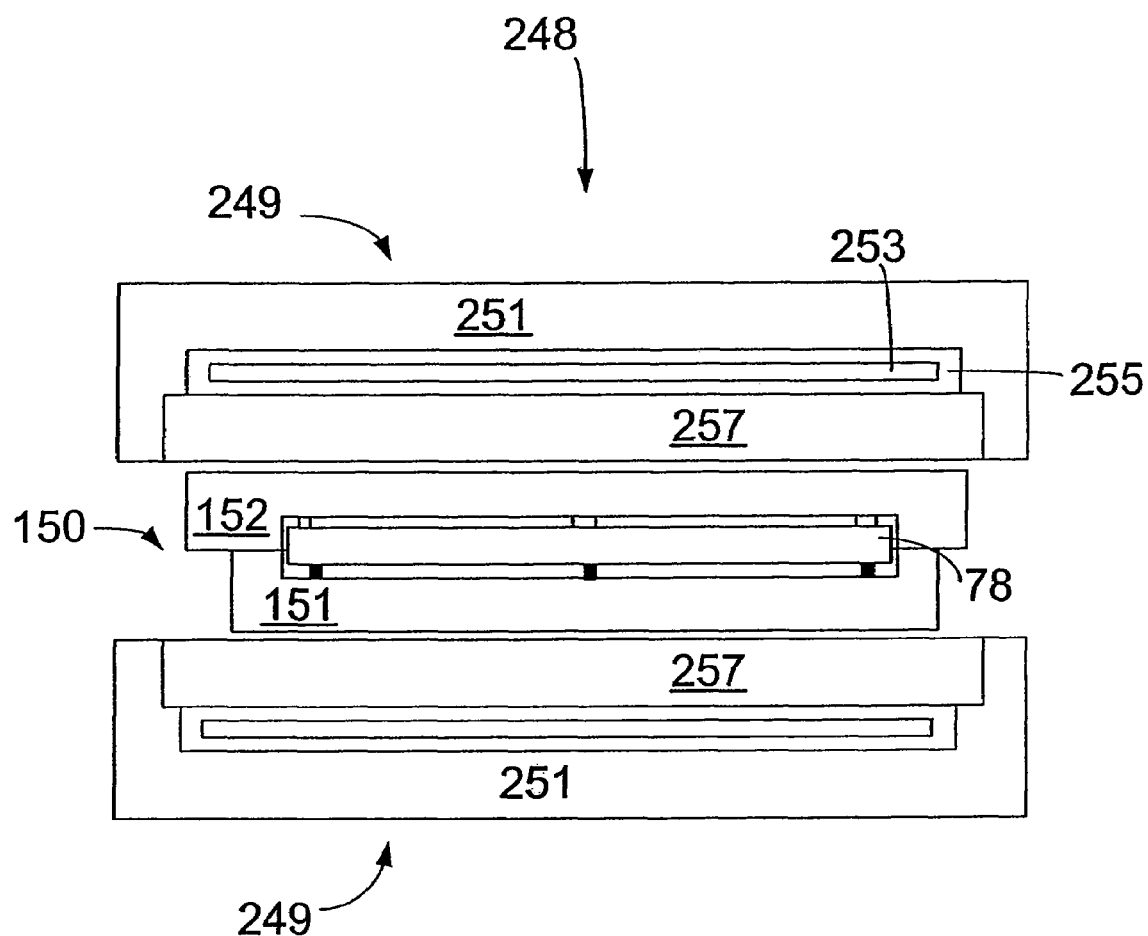
FIG. 26 illustrates a cross sectional side view of a clean filter pod according to some embodiments of the invention and an exemplary apparatus for providing thermophoretic protection to the reticle within the clean filter pod.

FIG. 26 illustrates a portion of a thermophoresis protection system 248 according to some embodiments of the invention for reticle 78 in a CFP 150 according to some embodiments of the invention. For discussion of thermophoresis see U.S. Pat. No. 6,110,844 to Rader et al., col. 1, line 65-col. 2, line 11, and U.S. Pat. No. 6,253,464 B1 to Klebenoff et al. at col. 2, lines 33-67 and col. 3, line 65 to col. 4, line 47, which text is incorporated herein by reference for all purposes. In some embodiments, top part 152 and bottom part 151 can each include a window. In some embodiments the window may be constructed of quartz, or fused silica. In some embodiments, the material for the window will have approximately the same coefficient of expansion as the selected frame material In some embodiments, the material will be inert and not outgas any hydrocarbons or water.

In some embodiments, a temperature control unit 249 can be in contact with each of top part 152 and bottom part 151. In some embodiments, temperature control unit 259 includes a housing 251, a radiative heater 253, and a liquid cooled quartz window 257. Housing 251 and liquid cooled quartz window 257 may form a space 255, which may be evacuated to avoid conductive and convective heat transfer from radiative heater 253 to liquid cooled window 257. System 248 provides thermophoretic protection for reticle 78 from particles in CFP 150 if radiative heater 253 transfers enough heat to reticle 78, and liquid cooled window 257 removes enough heat from top part 152 or bottom part 151 to keep reticle 78 at a higher temperature than top part 152 and bottom part 151. When a temperature difference exists, a temperature gradient will form in the gas surrounding reticle 78 that creates a force on particles from warmer temperatures to cooler temperatures and, therefore, away from reticle 78. Temperature differences as small as a few degrees can provide significant thermophoretic protection.

Figure 27:
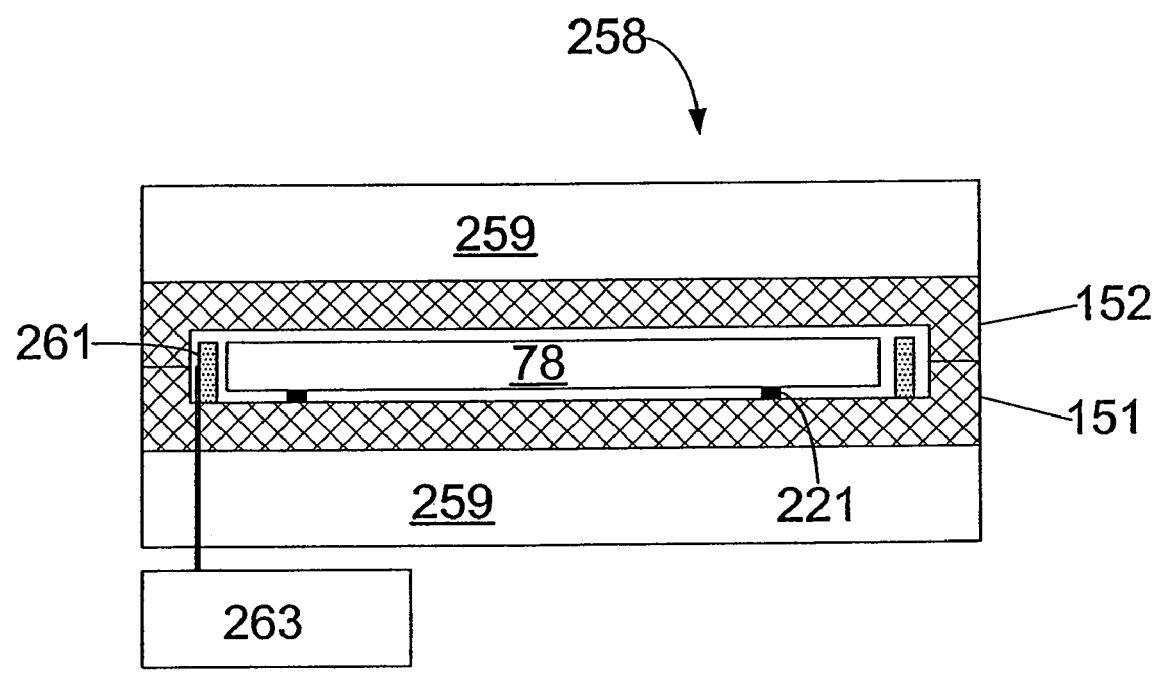
FIG. 27 illustrates a cross sectional side view of a clean filter pod according to some embodiments of the invention and another exemplary apparatus for providing thermophoretic protection to the reticle within the clean filter pod.

FIG. 27 illustrates a thermophoresis protection system 258 according to some embodiments of the invention for reticle 78. Top part 152 and bottom part 151 each are in contact with a heat sink, or in other words, an outside cooling source 259 that removes heat from the system, specifically, from top part 152 and bottom part 151. CFP 150 includes a heating element 261 mounted to either top part 152 or bottom part 151. In some embodiments, heating element 261 is mounted to bottom part 151. In some embodiments, insulation may be used between heating element 261 and CFP 150 to reduce heat transfer from heater 261 to CFP 150. In some embodiments, heating element 261 is connected to an external power supply and ohm meter 263. Heating element 261 may also be used as a temperature sensor by measuring the electrical resistance of heating element 261. Since the resistance changes as a function of temperature, a measurement of the resistance would indicate the temperature of element 261, from which the edge temperature of reticle 78 could be calibrated. Electrical contacts may be located on top part 152 and bottom part 151 for conducting electrical power to heating elements 261.

System 258 provides thermophoretic protection for reticle 78 from particles in CFP 150 if heating element 261 transfers enough heat to reticle 78, and heat sink 259 removes enough heat from top part 152 or bottom part 151 to keep reticle 78 at a higher temperature than top part 152 and bottom part 151. Heat sink 259 could be a fluid (gas or liquid) or a solid. When a temperature difference exists, a temperature gradient will form in the gas surrounding reticle 78 that creates a force on particles from warmer temperatures to cooler temperatures and, therefore, away from reticle 78. This embodiment would allow for non-uniform heat transfer to the edge of reticle 78 to minimize the temperature variation within reticle 78. Uniform heat transfer to the entire perimeter of reticle 78 creates corners with higher temperatures and, therefore, more variation. Reduced temperature variation produces less reticle distortion, which is desirable.

Figure 28:
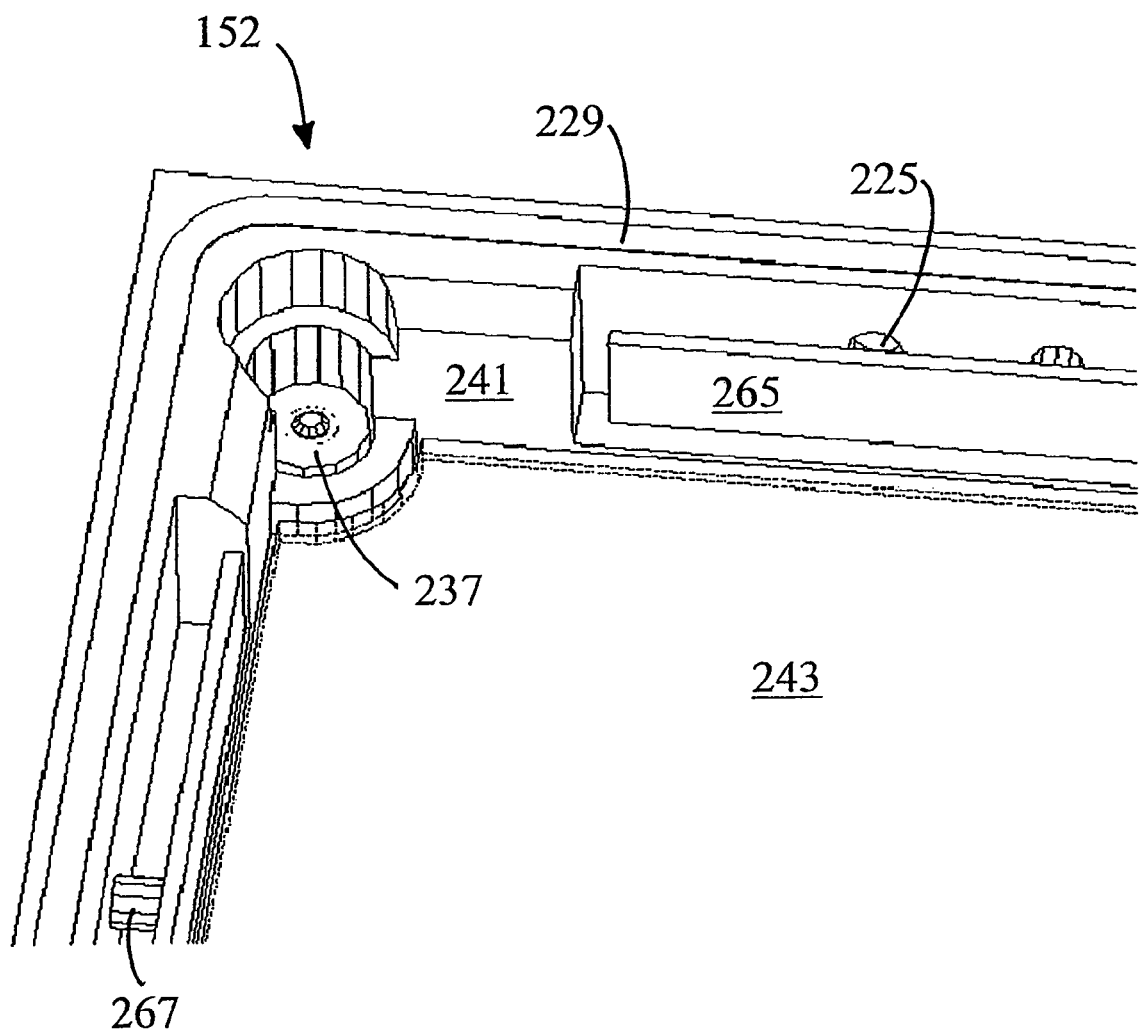
FIG. 28 illustrates a perspective view of the underside of a clean filter pod top part according to some embodiments of the invention illustrating a sealing surface, reticle clamping mechanism, clean filter pod top window and resistive heaters.

FIG. 28 is a detail of a portion of a CFP according to some embodiments of the invention. A corner of top part 152 is illustrated from the bottom. In some embodiments, sealing material 229 on the surface of frame 241 contacts the mating material in bottom part 151. In FIG. 28, a bellows 239 is disposed in a corner of frame 241. Top cover 243 is also depicted. Heating element 261 and heating support (insulation) 265 as attached to frame 241 are also depicted. Note that they do not extend all the way to the corner. Frame 241 may be an aluminum frame. As previously described, cover 243 may be constructed of quartz. In some embodiments, sealing material 229 is magnetized nickel. In some embodiments, bellows 239 is includes magnetized nickel. In some embodiments, filter 225 may be disposed in a frame opposite heating element 261. When heating element 261 is between filter 225 and reticle 78, particles that do enter CFP 150 through filter 225 are driven thermophoretically away from reticle 78.

Figure 29:
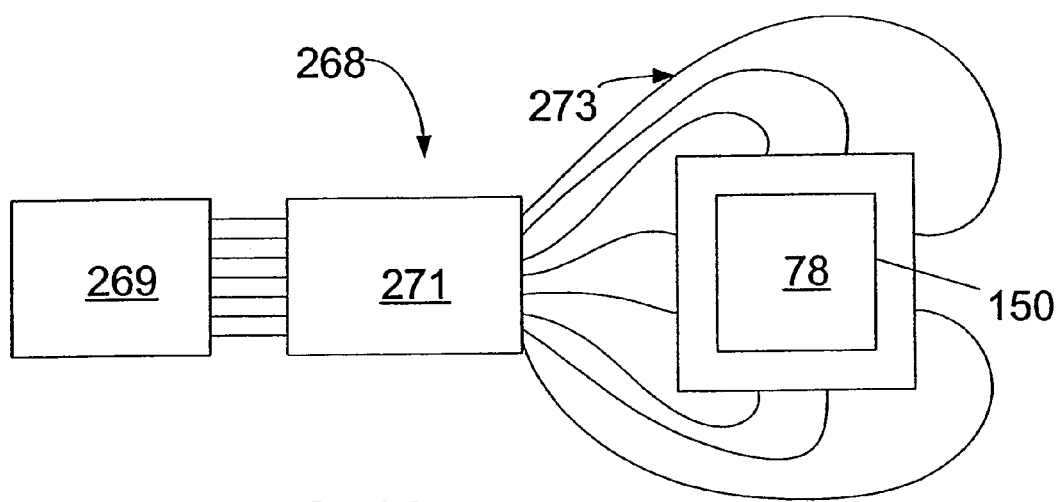
FIG. 29 illustrates a diagram of a reticle in a clean filter pod according to some embodiments of the invention heated by an exemplary laser diode system.

FIG. 29 illustrates another heating system for use within a thermophoretic protection system. In some embodiments, system 268 includes laser diode array 269, connected to a homogenizer 271. In some embodiments, homogenizer 271 can be connected to multiple fibers 273 that are connected to the outside of CFP 150. In some embodiments, CFP 150 would have mating optical fibers to shine light through CFP 150 and on to the edges of reticle 78. The light is absorbed by the reticle, which is thereby heated. If the reticle absorbs much of the light, relatively little incidental heating of the CFP 150 results. Note that less light may be absorbed if reticle 78 has electrically conductive film on its edges. However, such a film could be accounted for if the absorption spectrum was known.

Figure 30:
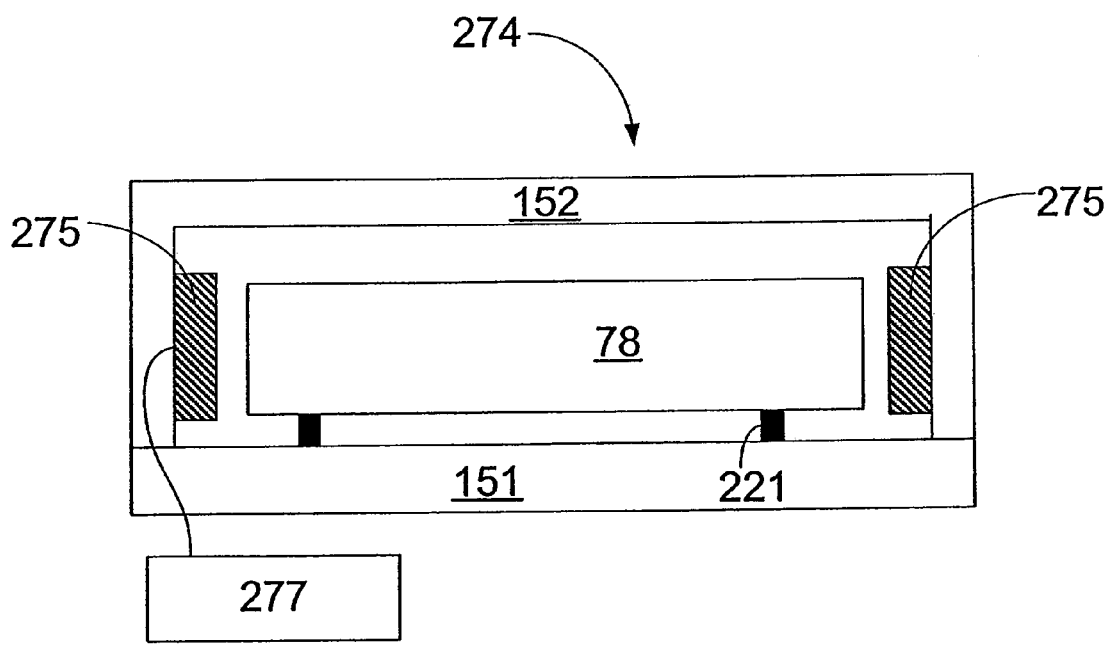
FIG. 30 illustrates cross sectional view of a reticle in a clean filter pod according to some embodiments of the invention protected thermophoretically by an exemplary Peltier heat pump.

FIG. 30 illustrates yet another heating system for use within a thermophoretic protection system. In some embodiments, system 274 includes thermoelectric chips (TECs) 275 mounted on at least one side of top part 152. TECs, also known as Peltier heat pumps, can transfer heat from top part 152 to reticle 78. In some embodiments, an electrical power could be supplied through top part 152 from electrical supply 227 to TEC 275. Of course, such a system could be used in conjunction with a heat sink to remove heat from the largest outer surfaces of top part 152 and bottom part 151. This embodiment does not require insulation between TEC 275 and CFP 150. It also more efficient and requires reticle 78 to obtain a lower approximate (recognizing reticle 78 may not have a uniform temperature) temperature relative to ambient or system temperature to provide a temperature gradient in the gas surrounding reticle 78 inside CFP 150. In some embodiments, TEC 275 may also be in contact with an edge of reticle 78 for conductive heat transfer to reticle 78.

Figure 31:
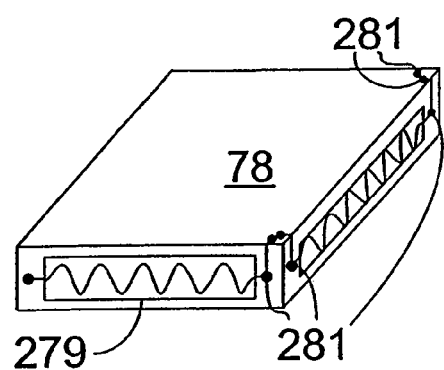
FIG. 31 illustrates a perspective view of a reticle and attached heaters for providing thermophoretic protection in a clean filter pod according to some embodiments of the invention.
Figure 32:
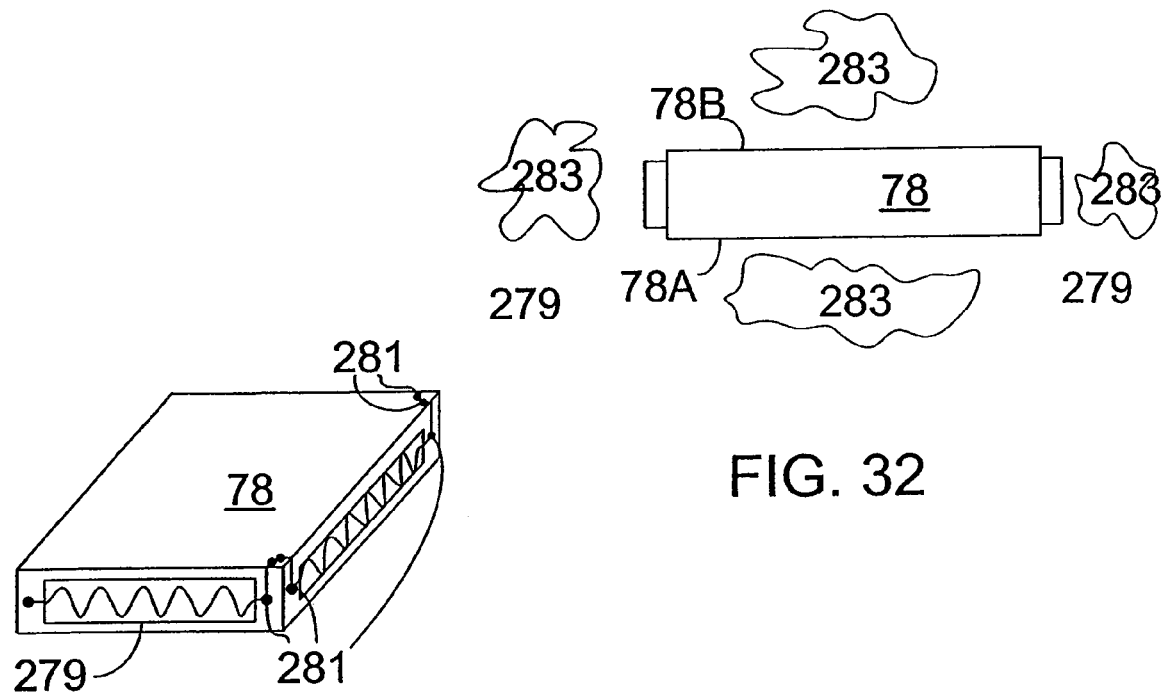
FIG. 32 illustrates a cross sectional side view of the reticle shown in FIG. 31.
Figure 33:
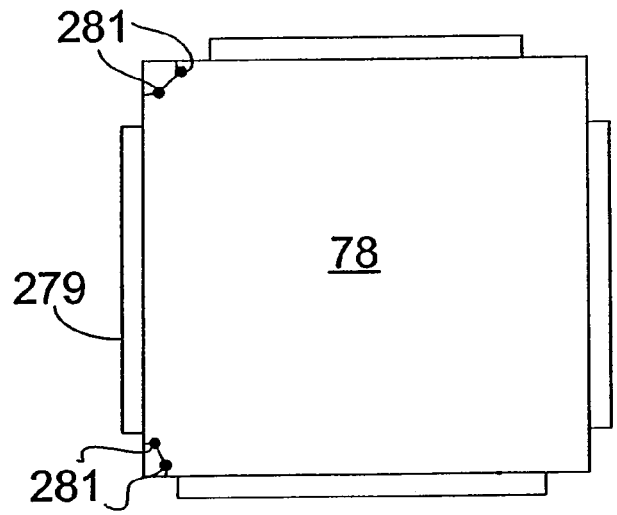
FIG. 33 illustrates a top view of the reticle shown in FIG. 31.

FIGS. 31-33 illustrate yet another heating system for use within a thermophoretic protection system. In some embodiments, resistive heaters 279 are attached directly to reticle 78. In some embodiments, electrical contacts 281 may be connected to heaters 279 and disposed on the front or backside of reticle 78. In some embodiments, electrical contacts may be disposed on sides of reticles 78. In some embodiments, electrical contacts are coincident with supporting and restraining contact points, i.e., from bellows 239 or standoff 221. In FIG. 32 (cross section), reticle 78 is depicted with side heaters 279 and surrounded by gas, which is necessary at some pressure to provide a thermophoretic effect between reticle 78 and top part 152 or bottom part 151. In some embodiments and depicted in FIG. 33, heaters 279 are disposed on all four vertical sides of reticle 78. However, in some embodiments, heaters 279 do not extend the entire length of any side, but cover approximately 80% of the side dimension. Such a non-uniform heating arrangement may reduce the temperature variation of reticle 78, which helps to reduce thermal distortion of reticle 78 and reduce the time required for reticle 78 to reach an acceptable temperature and level of distortion before reticle 78 is attached to stage 84. Moreover, the direct contact heats reticle 78 more efficiently in low vacuum pressure environments where conductive heat transfer in the gas between resistive heating elements 261 and reticle 78 is relatively inefficient.

As indicated in the table below, attaching a heater directly to reticle 78 is advantageous because less power is required to maintain the minimum temperature difference between reticle 78 and CFP 150. Moreover, the approximate temperature of reticle 78 is lower, thus there is a smaller risk of damaging reticle 78 multi-layer (pattern), and less time is required to reach ambient or system temperature before chucking reticle 78 to stage 84.

difference between the reticle and ambient temperature is envisioned to minimize reticle temperature differential effects when chucked.

Figure 35:
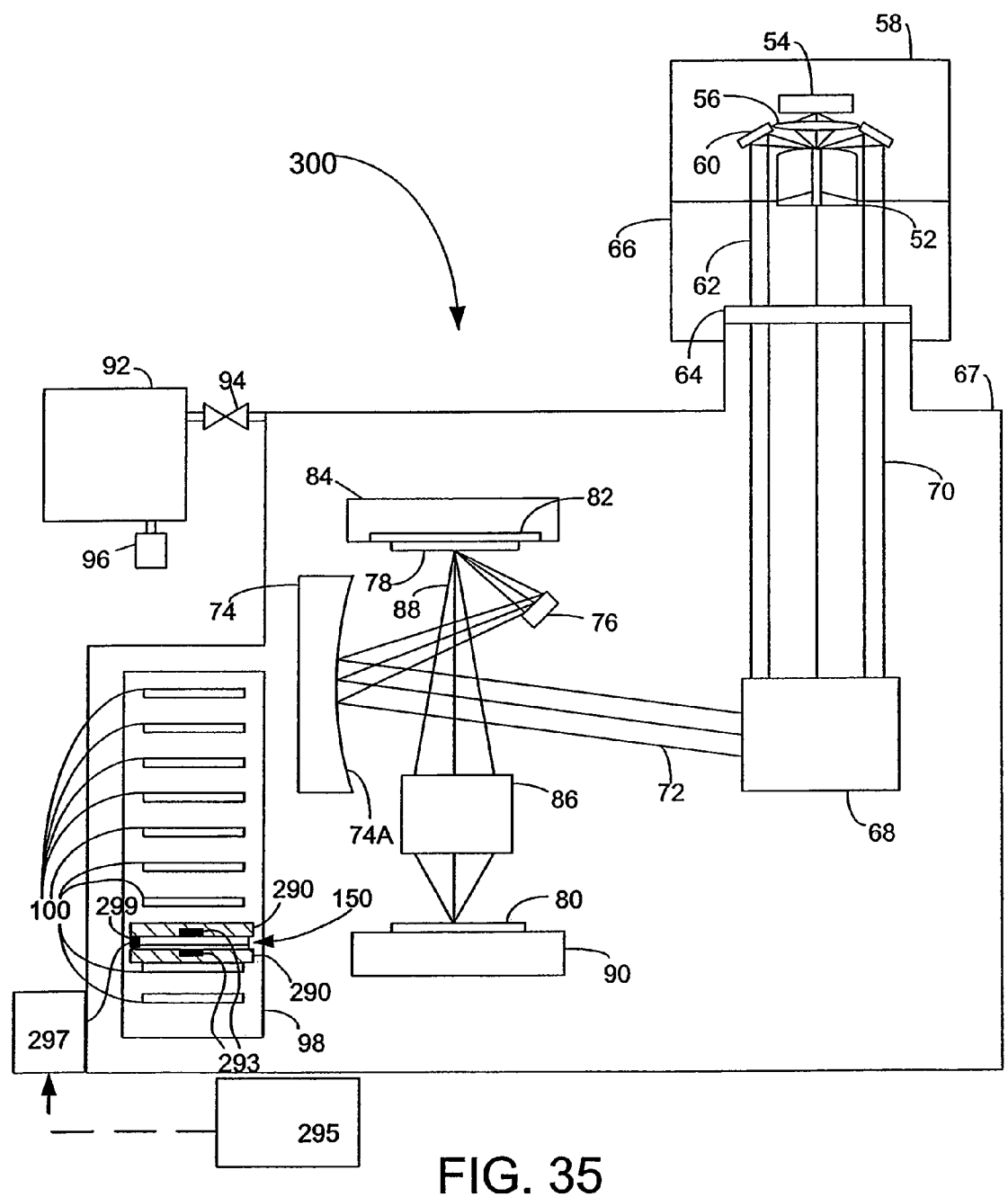
FIG. 35 illustrates a side view diagram of a lithography system according to some embodiments of the invention.

A lithographic exposure system with which any of the foregoing embodiments of clean filter pods can be used is shown schematically in FIG. 35. Any clean filter pod as described above can be used, with any combination of the various features discussed (sealing materials, standoffs, horizontal motion restraints, clamping forces, heaters and cooling sources, design of CFP structure, material selection for windows.

Thus, for example, the reticle library may have electrical power connections and heat sinks built into supports 100 (see FIG. 1). As depicted in FIG. 35, reticle library 98 includes support 100 to support at least CFP 150. In some embodiments, reticle library 98 may also include one or more heat sinks 290. In some embodiments, heat sinks 290 may be like heat sinks 257 or 259 as previously described. In some embodiments, reticle library 98 may also a data acquisition

| Analysis | Heater attached to | Pressure (Pa) | Heater Temp (° C.) | Power Input (Watts) | Min. Temp. Diff. between Reticle and CFP (° C.) | Approximate Reticle Temperature (° C.) |
|---|---|---|---|---|---|---|
| 1 | reticle | 7 | 26 | 0.3 | 1 | 25 |
| 2 | reticle | 101000 | 39 | 3.2 | 1 | 30 |
| 3 | CFP | 7 | 88 | 8.2 | 1 | 65 |
| 4 | CFP | 101000 | 84 | 15.0 | 1 | 50 |

Figure 34:
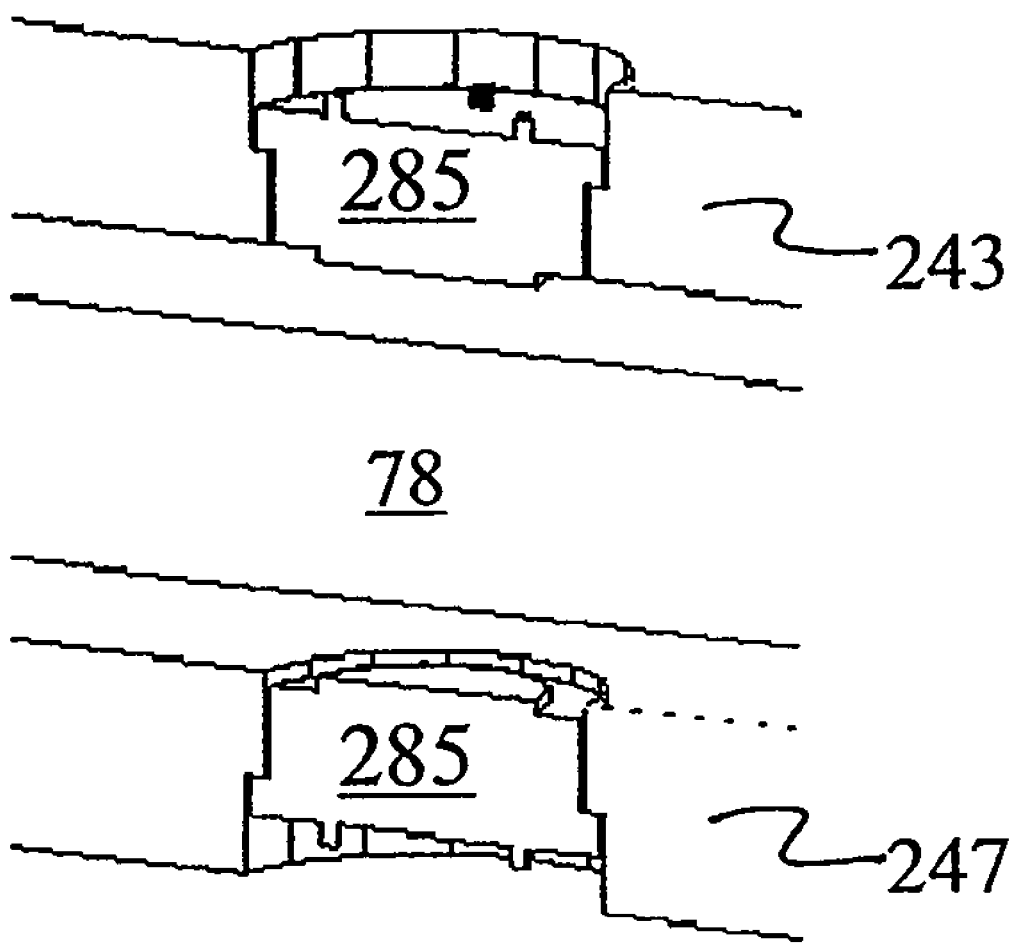
FIG. 34 illustrates a detail of a CFP according to some embodiments of the invention including temperature sensors to measure the temperature of the CFP and enclosed reticle.

FIG. 34 shows a detail of a CFP according to some embodiments of the invention. In some embodiments, CFP 150 may include sensors to measure the temperature of the top and bottom surface of reticle 78. In some embodiments, CFP 150 may include sensors to measure the temperature of top part 152 and bottom part 151. Specifically, in some embodiments, and as depicted in FIG. 34, CFP 150 may include a combination sensor 285 disposed in top cover 243 and a combination sensor 285 disposed in bottom cover 247. Combination sensor 285 may include a thermistor to measure the temperature of the surrounding material in which it is located and an IR sensor to measure the temperature of a surface in front of it. Thus, as depicted in FIG. 34, sensor 285 can measure the temperature of top cover 243 and the temperature of the backside of reticle 78. Or, for sensor 285 disposed in bottom cover 247, sensor 285 can measure the temperature of bottom cover 287 and the temperature of the frontside of reticle 78. When connected to data acquisition software, these sensors can provide feedback for controlling the heat input through the selected heating system and the heat output through the selected heat sink. Temperature sensors 285 are well known in the art and need not be described in further detail. An example of temperature sensor 285 is produced by General Electric, located in the U.S.

A thermophoretic protection apparatus may be used in at least the load lock, the reticle library, and the pre-aligner. The reticle temperature may be controlled such that a thermophoretic effect continues during the transfer periods where it is more difficult to provide electrical power through the robots to the electrical contact on the CFP to power the heaters on either the CFP or reticle. The reticle temperature however, should not be significantly higher than ambient, because if portions of the reticle cool significantly in the reticle stage chuck, the reticle may distort and create errors in the transferred pattern. In some embodiments, a 0.5° C. temperature system 293 to acquire temperature data from temperature sensor 285. In some embodiments, temperature data may be used by a controller 295 to regulate power from power supply 297 connected through electrical contacts 299 to a heater within CFP (whether attached to CFP 150 or reticle 78 or both). Electrical power connections may contact electrical contacts on CFP 150 and conduct electrical power to a heating system, whether attached to CFP 150 or reticle 78. In some embodiments, controller 295 may also use temperature data from temperature sensors 285 to control the cooling rates of heat sink 290. In some embodiments, control of the heating and cooling will control the temperature gradient present in the gas between a reticle surface and a CFP internal surface.

Figure 36:
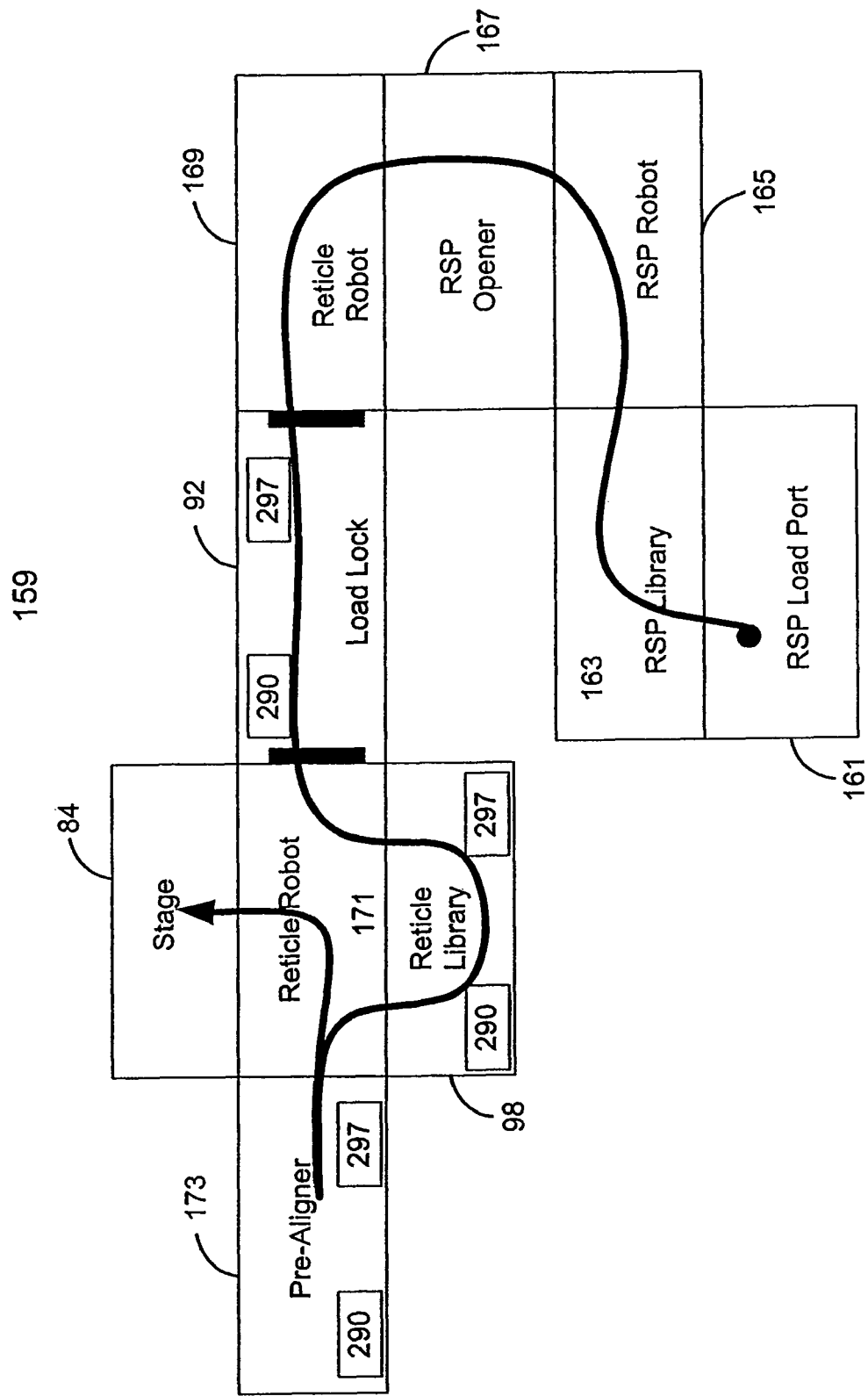
FIG. 36 illustrates a layout of a lithography system according to some embodiments of the invention.

Other components or stations of a lithography system according to some embodiments of the invention may also have such above described components. FIG. 36 illustrates pre-aligner 173, load lock 92, in addition to reticle library 98 having at least one or more heat sinks 290 and electrical power supply 295 and associated electrical contacts 297.

Many of the components and their interrelationships in this system are known in the art, and hence are not described in detail herein.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 37:
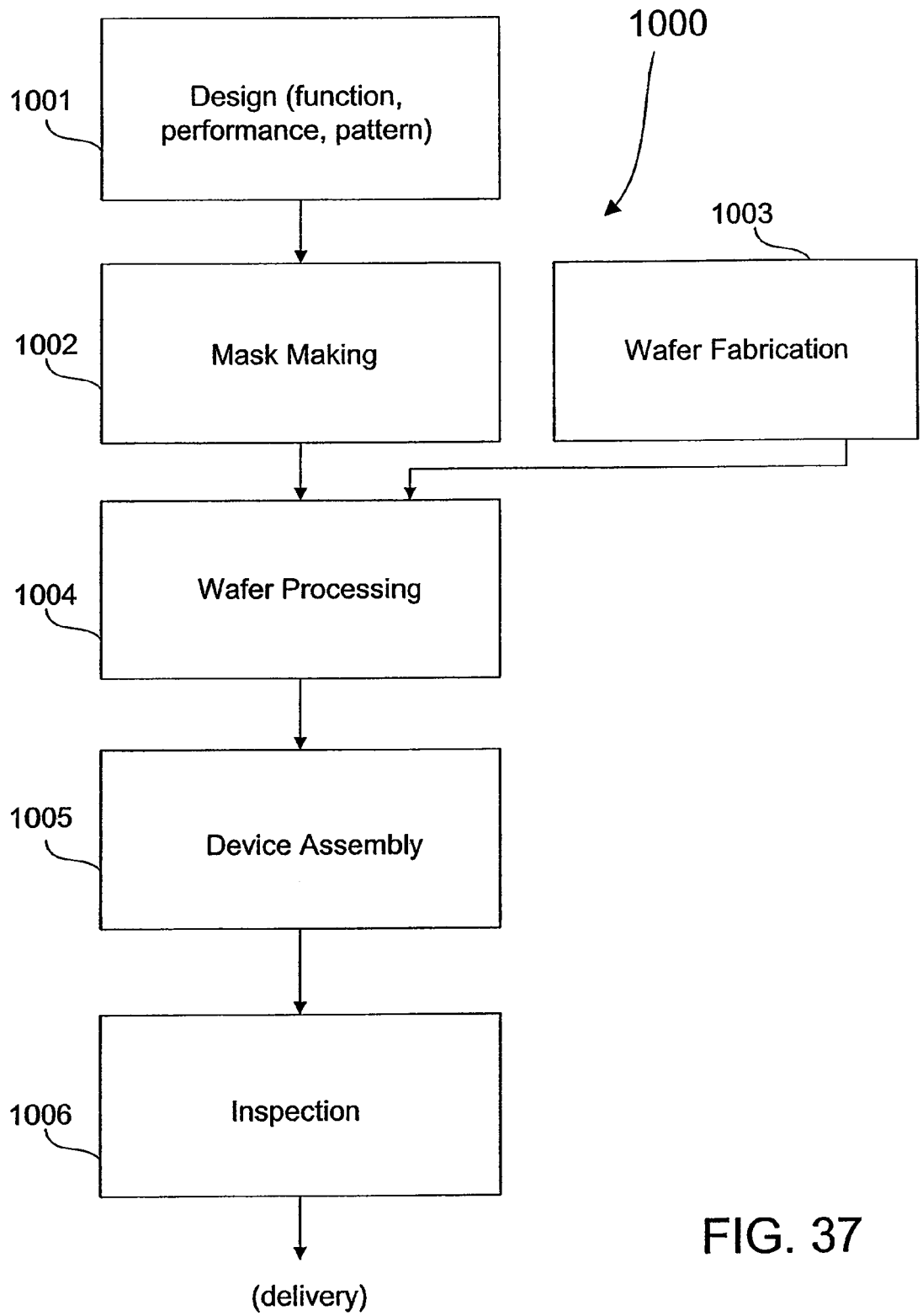
FIG. 37 is a flow chart of a process of fabricating semiconductor devices.

Further, semiconductor devices can be fabricated using the above described systems, by process 1000 shown generally in FIG. 37. In step 1001 the device's function and performance characteristics are designed. Next, in step 1002, a mask (reticle) having a pattern designed according to the previous designing step, and is manufactured, including the exemplary method described in conjunction with FIG. 2. hereinabove. In a parallel step 1003, a wafer is made from a silicon material. The mask pattern designed in step 1002 is exposed onto the wafer from step 1003 in step 1004 by a photolithography system described hereinabove according to the principles of the present invention. In step 1005 the semiconductor device is assembled (including the dicing process, bonding process and packaging process), then finally the device is inspected in step 1006.

Figure 38:
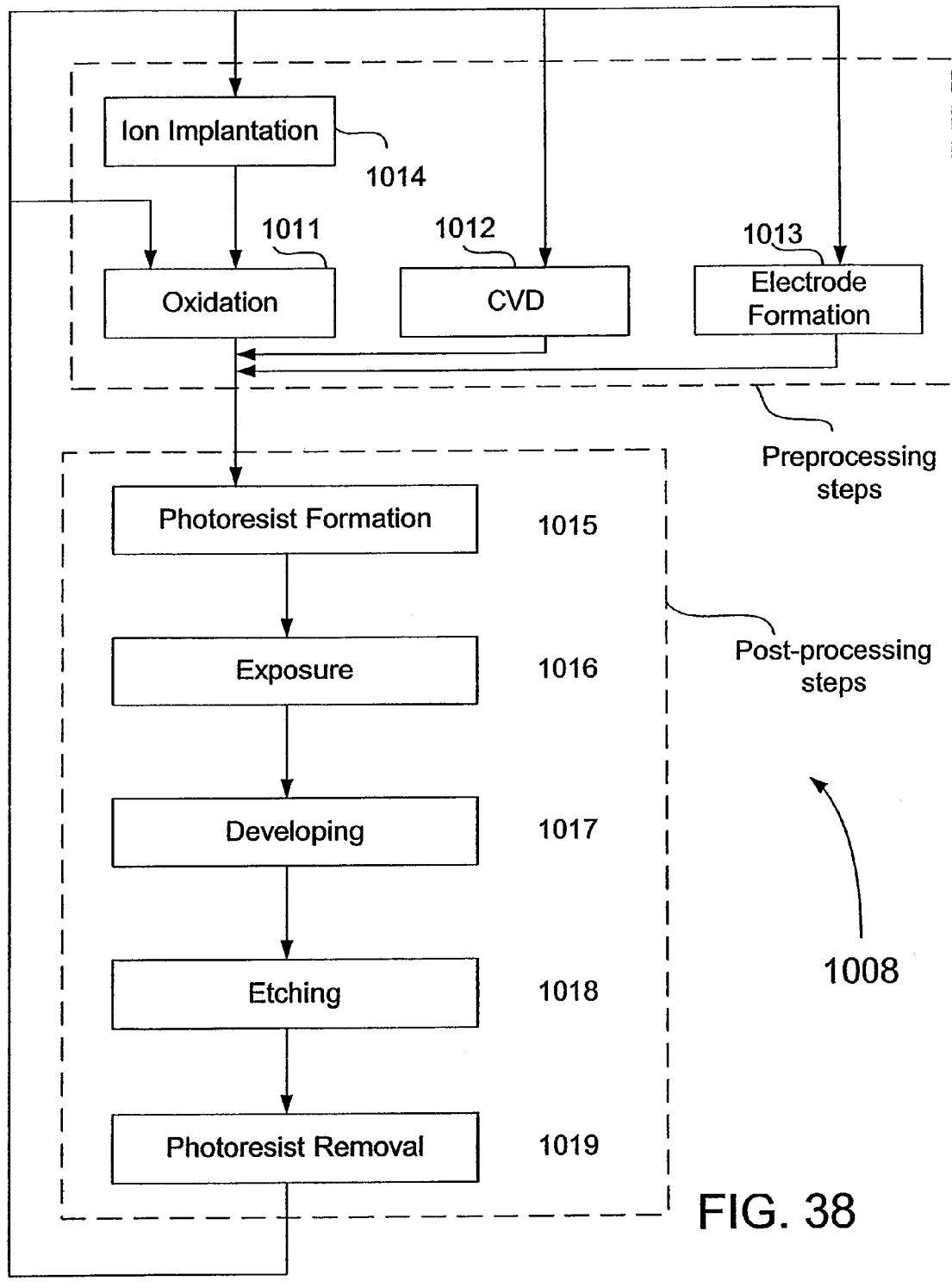
FIG. 38 is a detailed flow chart of the above mentioned step 1004 of the process shown in FIG. 37.

FIG. 38 illustrates a detailed flowchart example of the above-mentioned step 1004 in the case of fabricating semiconductor devices. In step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 1015 (photoresist formation step), photoresist is applied to a wafer. Next, in step 1016, (exposure step), the above-mentioned exposure device is used to transfer the circuit pattern of a mask (reticle) to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

Other embodiments according to some embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for conveying a reticle comprising:
   covering a first surface of the reticle by a first cover;
   covering a second surface of the reticle by a second cover;
   placing the reticle in a reticle carrier that covers the first cover and the second cover and applies a clamping force to the reticle;
   opening the reticle carrier;
   opening a first gate of a first enclosed station;
   conveying the reticle into the first enclosed station with the first cover and the second cover in contact with each other;
   closing the first gate of the first enclosed station;
   changing the inner condition of the first enclosed station from an atmospheric condition to a vacuum condition;
   opening a second gate of the first enclosed station;
   conveying the reticle with the first cover and the second cover in contact with each other from the first enclosed station to a second enclosed station which has a vacuum condition;
   after conveying the reticle from the first enclosed station to the second enclosed station, releasing the contact between the first cover and the second cover; and
   separating the reticle from the second cover.

2. The method according to claim 1, wherein the second enclosed station includes an exposure chamber with an illuminating light source, and the method further comprises:
   conveying the reticle along with the first cover to a reticle stage located in the exposure chamber;
   mounting the reticle onto the reticle stage;
   separating the first cover from the reticle; and
   illuminating a light to the reticle.

3. The method of claim 2, further comprising:
   re-covering the first surface of the reticle with the first cover;
   conveying the reticle along with the first cover from the reticle stage located in the exposure chamber to a covering position located in the second enclosed station;
   re-covering the second surface of the reticle with the second cover;
   opening the second gate;
   conveying the reticle with the first cover and the second cover in contact with each other from the second enclosed station to the first enclosed station;
   closing the second gate;
   changing the inner condition of the first enclosed station from a vacuum condition to an atmospheric condition; and
   opening the first gate of the first enclosed station.

4. The method of claim 1, further comprising:
   re-covering the second surface of the reticle with the second cover;
   opening the second gate;
   conveying the reticle with the first cover and the second cover in contact with each other from the second enclosed station to the first enclosed station;
   closing the second gate;
   changing the inner condition of the first enclosed station from a vacuum condition to an atmospheric condition; and
   opening the first gate of the first enclosed station.

5. A method for conveying a reticle, comprising:
   conveying a reticle on a reticle stage from an exposure position to a covering position;
   covering a first surface of the reticle with a first cover;
   conveying the reticle along with the first cover from the reticle stage to a first station having a vacuum condition;
   covering a second surface of the reticle with a second cover while the reticle is in the first station;
   opening a first gate of a second station;
   conveying the reticle with the first cover and the second cover in contact with each other from the first station to the second station;
   closing the first gate;
   changing the inner condition of the second station from a vacuum condition to an atmospheric condition;
   opening a second gate of the second station; and after conveying the reticle to the second station, placing the reticle in a reticle carrier that covers the first cover and the second cover and applies a clamping force to the reticle.

6. A method for conveying a reticle comprising:
opening a reticle carrier that covers a first cover and a second cover of a reticle and applies a clamping force to the reticle;
opening a first gate of a first enclosed station;
conveying the reticle covered by the first cover and the second cover into the first enclosed station with the first cover and the second cover in contact with each other;
closing the first gate of the first enclosed station;
changing the inner condition of the first enclosed station from an atmospheric condition to a vacuum condition;
opening a second gate of the first enclosed station;
conveying the reticle with the first cover and the second cover in contact with each other from the first enclosed station to a second enclosed station which has a vacuum condition;
after conveying the reticle from the first enclosed station to the second enclosed station, releasing the contact between the first cover and the second cover; and
separating the reticle from the second cover.

7. The method according to claim 6, wherein the second enclosed station includes an exposure chamber with an illuminating light source, and the method further comprises:
conveying the reticle along with the first cover to a reticle stage located in the exposure chamber;
mounting the reticle onto the reticle stage;
separating the first cover from the reticle; and
illuminating a light to the reticle.

8. The method of claim 7, further comprising:
re-covering the second surface of the reticle with the second cover;
opening the second gate;
conveying the reticle with the first cover and the second cover in contact with each other from the second enclosed station to the first enclosed station;
closing the second gate;
changing the inner condition of the first enclosed station from a vacuum condition to an atmospheric condition; and
opening the first gate of the first enclosed station.

9. The method of claim 6, further comprising:
re-covering the second surface of the reticle with the second cover;
opening the second gate;
conveying the reticle with the first cover and the second cover in contact with each other from the second enclosed station to the first enclosed station;
closing the second gate;
changing the inner condition of the first enclosed station from a vacuum condition to an atmospheric condition; and
opening the first gate of the first enclosed station.

* * * * *